United States Patent [19]

Markle et al.

[11] Patent Number: 5,402,205
[45] Date of Patent: Mar. 28, 1995

[54] ALIGNMENT SYSTEM FOR A HALF-FIELD DYSON PROJECTION SYSTEM

[75] Inventors: David A. Markle, Saratoga; Gerald J. Alonzo, Los Gatos; Hwan J. Jeong, Los Altos, all of Calif.

[73] Assignee: Ultratech Stepper, Inc., San Jose, Calif.

[21] Appl. No.: 993,795

[22] Filed: Dec. 21, 1992

[51] Int. Cl.$^6$ .............................. G03B 27/42
[52] U.S. Cl. ...................... 355/53; 355/43
[58] Field of Search ............... 355/43, 53, 66; 250/201.2; 359/727

[56] References Cited

U.S. PATENT DOCUMENTS

| | | | |
|---|---|---|---|
| 3,937,556 | 2/1976 | Newell | 350/30 |
| 3,951,546 | 4/1976 | Markle | 355/51 |
| 3,963,353 | 6/1976 | Hemstreet | 356/168 |
| 4,425,037 | 1/1984 | Hershel et al. | 355/43 |
| 4,585,337 | 4/1986 | Phillips | 355/45 |
| 4,650,315 | 3/1987 | Markle | 355/43 |
| 4,742,376 | 5/1988 | Phillips | 355/77 |
| 4,931,494 | 7/1983 | Hershel | 350/442 |
| 4,964,705 | 10/1990 | Markle | 350/442 |
| 5,003,345 | 3/1991 | Markle | 355/53 |
| 5,040,882 | 8/1991 | Markle | 359/727 |
| 5,164,794 | 11/1992 | Markle | 356/394 |
| 5,266,790 | 11/1993 | Markle et al. | 250/201.2 |
| 5,303,001 | 4/1994 | Jeong et al. | 355/53 |

*Primary Examiner*—Richard A. Wintercorn
*Attorney, Agent, or Firm*—George J. Seligsohn

[57] ABSTRACT

An alignment system for a unit magnification system (such as a Half-Field Dyson system) for use in microlithography is provided. The alignment system provides for aligning a pattern on a reticle with a complementary pattern on a wafer.

23 Claims, 22 Drawing Sheets

ALIGNMENT SYSTEM FOR A HALF-FIELD DYSON PROJECTION SYSTEM

CROSS-REFERENCE TO RELATED APPLICATIONS

The present application is related to the following applications filed concurrently with the present application and assigned to the same assignee as the present application: Ser. No. 993,547, U.S. Pat. No. 5,266,790 issued Nov. 30, 1993, entitled "Focusing Technique Suitable for Use with an Unpatterned Specular Substrate"; Ser. No. 994,239 (U.S. Pat. No. 5,303,001), entitled "Illumination: System for Half-Field Dyson Stepper"; and Ser. No. 994,238 (U.S. Pat. No. 5,329,332 issued Jul. 12, 1994), entitled "System for Achieving a Parallel Relationship between Surfaces of Wafer and Reticle of Half-Field Dyson Stepper".

BACKGROUND OF THE INVENTION

The present invention relates generally to a projection system for printing circuit patterns on photoresist coated wafers in semiconductor microlithography. It relates in particular to a class of projection systems wherein a photoresist coated silicon wafer is covered with circuit patterns by sequentially exposing different areas of the wafer. Such a system is generally referred to as a step-and-repeat exposure system or simply a stepper.

The present invention relates more particularly to an alignment system for a unit magnification optical projection system for use in microlithography such as described in U.S. Pat. No. 4,964,705 which is assigned to the same assignee as the present invention, and the details of which are hereby incorporated by reference.

That unit magnification projection system is a unit magnification, achromatic, anastigmatic, optical projection system that uses both reflective and refractive elements in a complementary fashion, i.e, a catadioptric optical system, to achieve large field sizes and high numerical apertures. In that system the reticle and wafer are parallel with a window being provided on the reticle adjacent to the patterned area to allow for the projection of the reticle (mask) pattern through the reticle window onto the wafer. The unit magnification system is referred to as a Half-Field Dyson system for reasons which will be explained in detail in the present specification.

Semiconductor wafer fabrication generally involves several stages of fabrication. A fabrication stage may include patterning a photoresist coated metalized wafer using a projection apparatus, developing the patterned resist to form a photoresist mask, and etching a pattern in the metal through the mask. Fabrication stages are carried out sequentially until a complete circuit having several layers of metallization or other circuit material is built up. At each fabrication stage a wafer must be exactly re-positioned or aligned with a reticle providing a layer pattern in such a way that all layers on the wafer will have the correct registration with each other. To facilitate correct alignment, a reticle may be provided with a set of one or more alignment keys, while a wafer may be provided with a corresponding set of one or more alignment targets. The projection apparatus may be provided with means for observing the positional relationship of the set of reticle keys with the corresponding set of wafer targets, and generating data which may be used to move the reticle and wafer with respect to one another to align the wafer targets with a projected image of the reticle keys. The wafer and reticle may thus be aligned such that a pattern on the reticle will be projected onto the wafer in correct alignment with other patterns which may be already on the wafer.

During the wafer fabrication process, alignment targets may be covered with photoresist material. Consequently, alignment for a projection system preferably is done using wavelengths at which the photoresist is transparent. A Half-Field Dyson projection system is illuminated, for projection purposes at a wavelength of about 248 nanometers (nm). UV photoresist materials are generally absorbing at 248 nm. An alignment system preferably is illuminated with a broad band of wavelengths, longer than 248 nm, to which the photoresist is transparent. Depending on fabrication steps and resists, it may be preferable to illuminate an alignment system with different bands of wavelengths at different stages of fabrication. Multiple wavelength capability is thus an important requirement for an alignment system to be used with a unit magnification projection system such as the Half-Field Dyson System.

SUMMARY OF THE INVENTION

It is an object of the present invention to provide an improved alignment system for use in a unit magnification optical projection system.

More specifically, the present invention is directed to an alignment system for a stepper employing a Half-Field Dyson projection system, in which the alignment system may be used to align an image of at least one key disposed on a reticle with at least one target disposed on a wafer. The one key includes a key diffraction-grating pattern having a given angular orientation and a given line spacing, and the one target includes a target diffraction-grating pattern having an angular orientation corresponding to the given angular orientation and a line spacing substantially equal to a predetermined integer multiple of the given line spacing.

The alignment system itself comprises first means including said Half-Field Dyson projection system for imaging alignment light diffracted from said one-key diffraction-grating pattern onto said wafer in response to said one-key diffraction-grating being illuminated with alignment light comprising a given range of wavelengths (1) first means including the Half-Field Dyson projection system for imaging alignment light diffracted from the one-key diffraction-grating pattern onto the wafer in response to the one-key diffraction-grating being illuminated with alignment light comprising a given range of wavelengths, and (2) second means for detecting coincidence in the position of the one wafer target and the position on the wafer of the image of the one reticle key, wherein the second means includes third means shaped, sized and positioned to have incident thereon only diffracted alignment light of at least two certain selected orders reflected from the one-target diffraction-grating pattern and substantially no diffraction-order alignment light reflected from the one-key diffraction-grating pattern, and the second means detects changes in the intensity of alignment light incident on the third means as the wafer and the reticle are moved relative to one another, whereby the one wafer target substantially coincides with the image on the wafer of the one reticle key when the intensity of alignment light incident on the third means is at a maximum.

BRIEF DESCRIPTION OF THE DRAWINGS

The accompanying drawings, which are incorporated in and form a part of this specification, illustrate embodiments of the invention and, together with the description, serve to explain the principles of the invention:

FIG. 6c depicts details of the pattern of FIG. 6a.

FIG. 8a depicts diffraction of light from the reticle patterns of FIG. 6a.

DETAILED DESCRIPTION OF THE PREFERRED EMBODIMENTS

Figure 1:
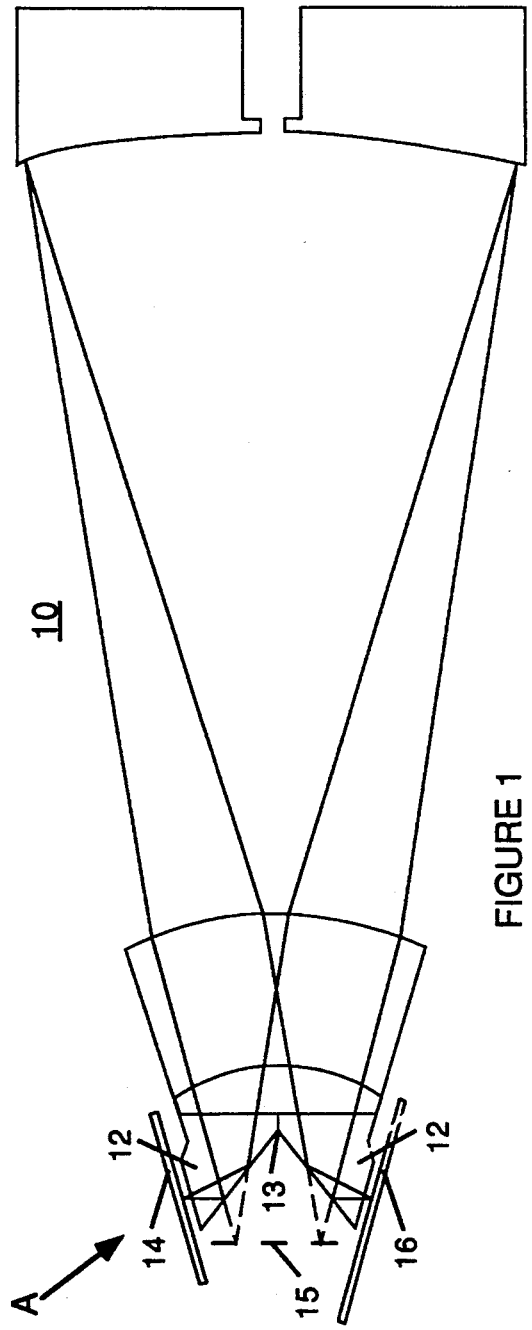
FIG. 1 depicts a folded Wynne Dyson projection system.

Reference will now be made in detail to the preferred embodiments of the invention, examples of which are illustrated in the accompanying drawings, wherein like components are designated by like reference numerals. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

As an alignment system of the present invention operates in conjunction with and may share optical elements of a Half-Field Dyson projection system, it may be helpful to review certain features and advantages of the Half-Field Dyson system before proceeding with a detailed description of the alignment system. Referring to FIG. 1, a diagram of a typical previous implementation of a Wynne-Dyson projection system 10 is shown. The Wynne-Dyson optical elements include folding prisms 12, having an apex 13, to separate the object and image planes which would otherwise be superimposed at a focal plane 15. The prisms 12 split the circular field into two symmetrical halves which become object and image planes or reticle and wafer fields 14 and 16. A Wynne Dyson system employs a transparent reticle. As such, illumination for the system may be directed into the system through reticle field 14 as indicated by arrow A.

Figure 1A:
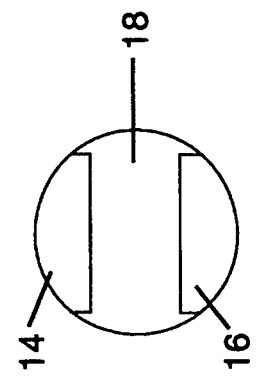
FIG. 1a depicts a small numerical aperture (NA) field format produced by the projection system of FIG. 1.
Figure 1B:
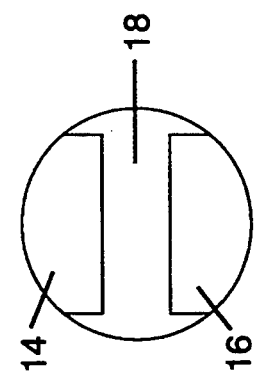
FIG. 1b depicts a medium NA field format produced by the projection system of FIG. 1.
Figure 1C:
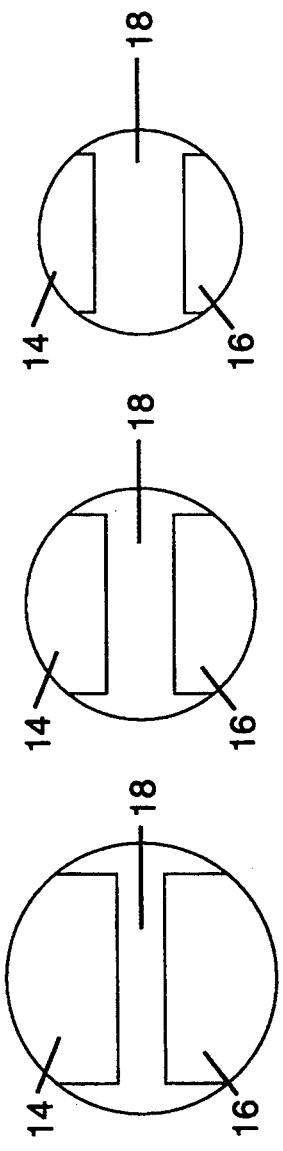
FIG. 1c depicts a large NA field format produced by the projection system of FIG. 1.

Because apex 13 of the two folding prisms 12 is some distance from focal plane 15, there is a vignetted stripe 18 (See FIG. 1a) across the center of the field which cannot be used for imagery. It is well known in the an that the numerical aperture (NA) of a projection system must be increased in order to form smaller geometries or circuit features on a wafer. When the numerical aperture is increased, unfortunately, the width of the vignetted strip is also increased, thereby decreasing the proportion of field available for useful imagery. This is illustrated in FIGS. 1a, 1b, and 1c which show, respectively, the fields produced by small, medium and large numerical apertures. With a NA above 0.5, less than 25% of the total field would be available for imagery, rendering such a system impractical.

The subject matter of the present invention is a subsystem of a projection system which may be referred to as a Half-Field Dyson system. Half-Field Dyson or ½D is the name given to an alternate way of implementing a Wynne Dyson projection system such as described in FIG. 1. The system is described in detail in U.S. Pat. No. 4,964,705, as described above. It is a catadioptric system including refractive optical elements and reflective optical elements. Reflection and refraction properties may also be combined in a single optical element.

With the ½D system, it is possible to achieve very high resolution over a large field and over a relatively broad spectral range with a very simple lens. The ½D system provides very nearly 50% of the total field available for imagery; thus the appellation Half-Field Dyson, ½D, or half-field Dyson means.

Figure 2:
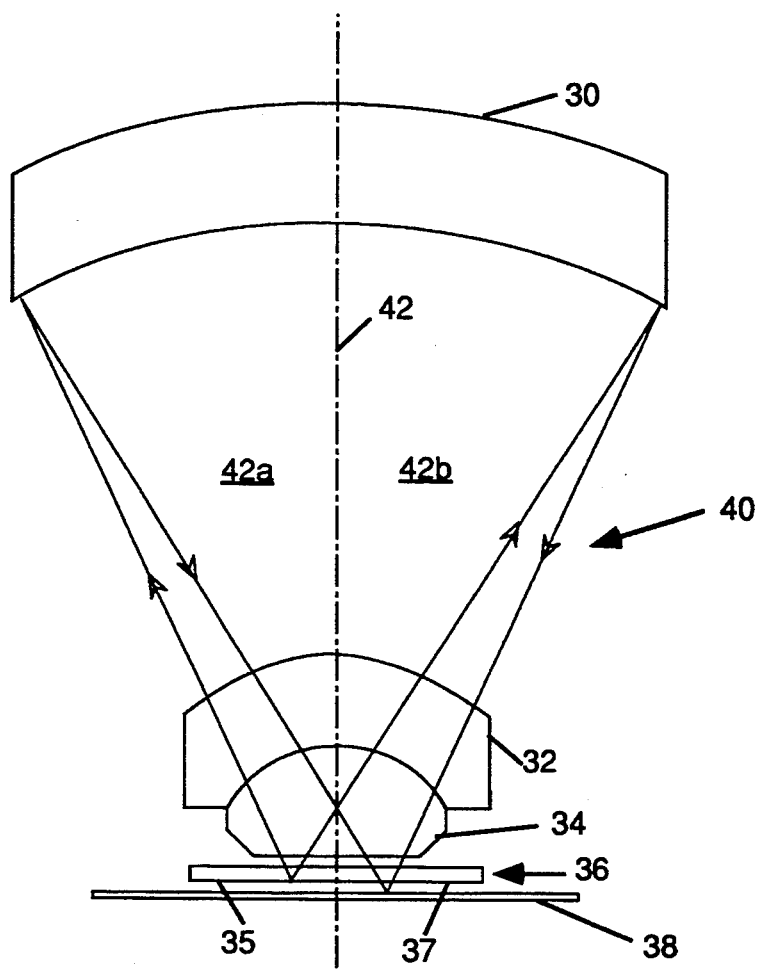
FIG. 2 depicts a deep UV Half-Field Dyson projection system.
Figure 4:
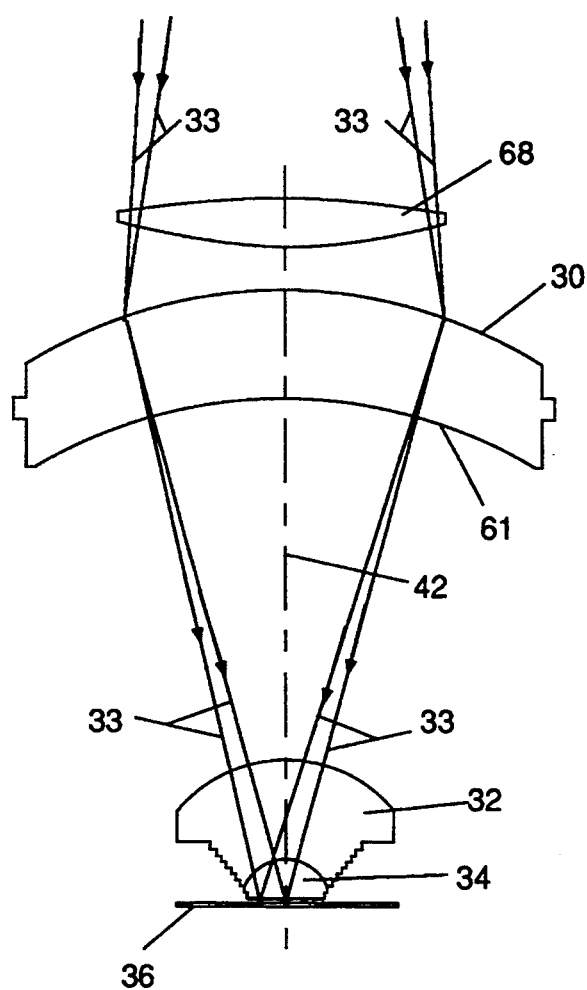
FIG. 4 depicts a Half-Field Dyson projection system including a portion of an illumination system.
Figure 5:
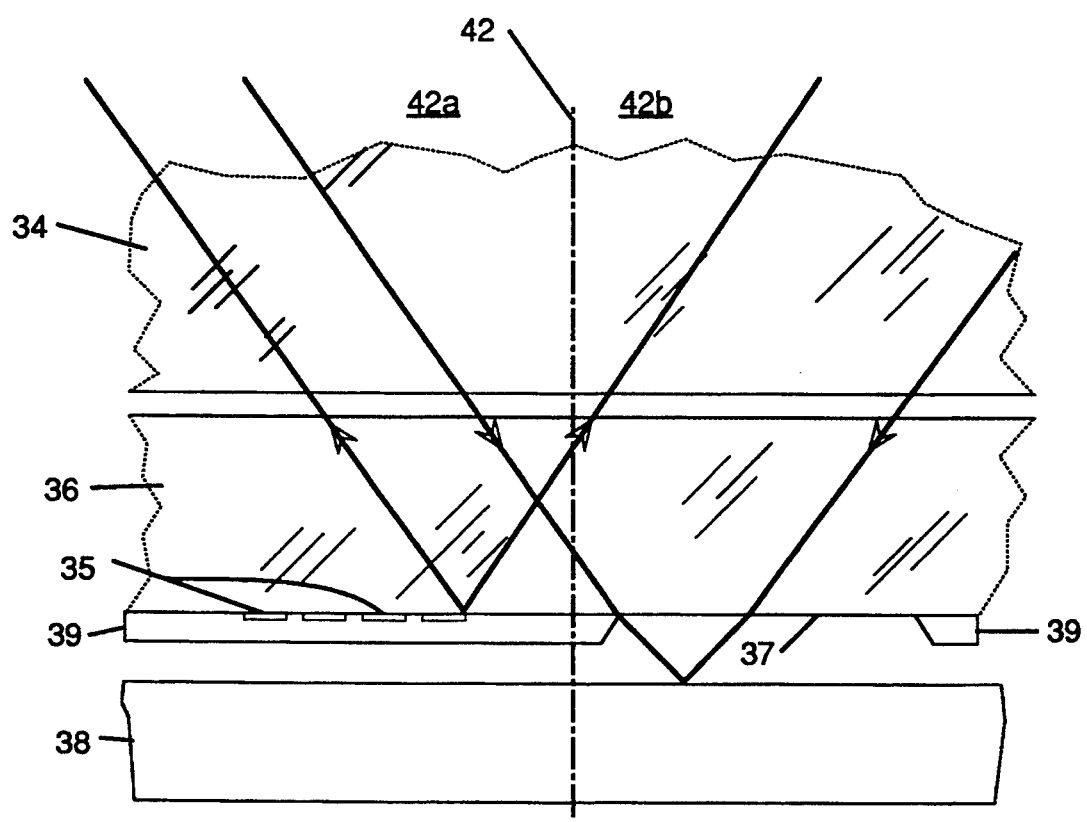
FIG. 5 depicts a cross section showing details of the reticle and wafer of FIG. 2.
Figure 5A:
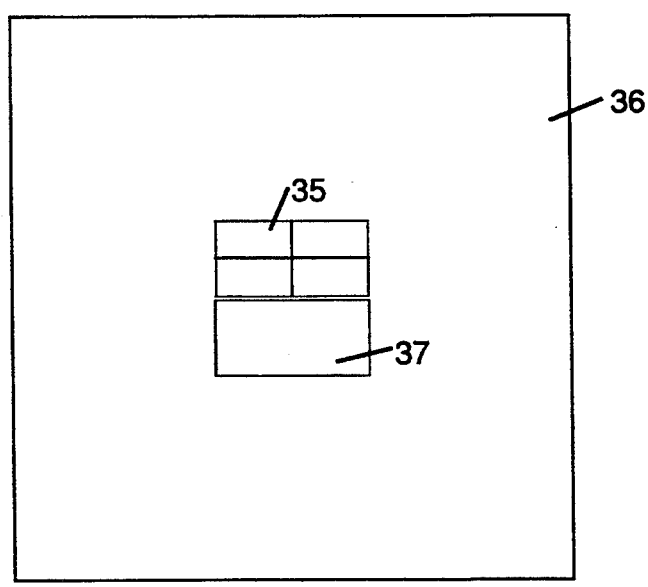
FIG. 5a depicts details of the reticle of FIG. 5.

Referring now to FIG. 2 a diagram of a deep UV (Ultra Violet), Half-Field Dyson projection system is shown. The system 40 includes a primary mirror-lens 30, a thick meniscus or negative lens 32, a plano convex or positive lens 34, a reticle 36, and a wafer 38. The system optical axis is shown by dotted line 42. The axial position of reticle 36, i.e, the object plane, is adjusted such that the image plane on wafer 38 is located a few thousandths of an inch below reticle 36, and parallel to it. As shown in FIGS. 4 and 5 incoming exposure light (rays 33) and a reflective reticle pattern 35 are constrained to one side 42a of optical axis 42 so that when the reticle 36 is imaged on the opposite side 42b of optical axis 42, the image forming light can pass through a window 37 in reticle 36 to wafer 38 located immediately below, To prevent any light from passing through reflective reticle pattern 35 to wafer 38, reticle 36 is coated with a thin, durable absorbing layer 39 which can be patterned to provide window 37 opposite pattern 35. The Half-Field Dyson system may be illuminated by an arrangement wherein illumination is introduced into the Half-Field Dyson system through system primary mirror-lens 30 (See FIG. 4). Primary mirror-lens 30 includes a front surface 61 including a reflective coating which is partially transparent to allow the passage of illuminating light and partially reflective for reflecting light in the projection system. The coating is preferably a multilayer dielectric coating having a relatively low absorption for the illuminating light wavelength.

Figure 3:
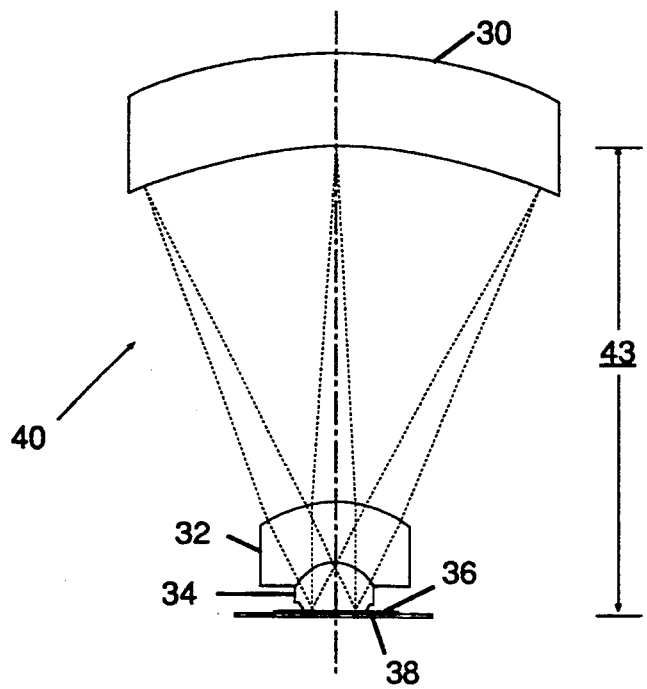
FIG. 3 depicts overall dimensions of an embodiment of the projection system of FIG. 2.
Figure 3A:
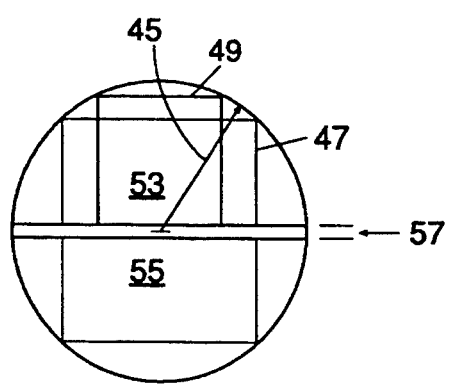
FIG. 3a depicts details and dimensions of a field format provided by the system of FIG. 3.

Referring now to FIGS. 3 and 3a, a system having a separation 43 of about 600 millimeters (mm) between the primary mirror-lens 30 and reticle 36 and wafer 38 focal planes may provide a useful field radius 45 of about 29 mm. As such a rectangular pattern having a height 47 of about 20 mm and a width 49 of about 40 mm may be accommodated, even with a numerical aperture as high as 0.7. Such a system illuminated by deep UV radiation, for example, radiation having a wavelength of about 248 nanometers (nm) would easily resolve a 0.25 micron feature. A pattern projected by such a system may contain $1.28 \times 10^{10}$ such features in the field. This is more than an order of magnitude increase in feature density compared with prior art projection systems illuminated by the G (436 nm) or I (365 nm) lines of a mercury arc lamp.

The system is sufficiently efficient that illumination may be provided by either a mercury arc lamp or an excimer laser. In one embodiment, the ½D system may be illuminated by a 6 nanometer (nm) bandwidth spectral band having a center wavelength of about 248 nm. The band may be selected from the output spectrum of a conventional high pressure mercury arc lamp by an optical filter.

The ½D system provides low lens distortion. Low lens distortion is desirable so that the pattern laid down by one tool can be precisely overlaid by a pattern from a second tool. Because of the high degree of symmetry of the ½D system, the design distortion may be as low as about 10 nm. This is considerably smaller than the distortion likely to be introduced by normal fabrication and alignment errors in the optical elements. A careful analysis of the effect of such errors shows that there are very few error sources and the distortion due to all sources should generally be well below 30 nm in a Half-Field Dyson system. Low distortion will also greatly facilitate production in fabrication lines containing many tools since the close match between different optical systems eliminates the need to keep track of which wafers were exposed by which tool.

The subject matter of the present invention is directed to an alignment system for aligning a wafer and a reticle in a unit magnification projection system, particularly a Half-Field Dyson projection system.

As discussed above, an alignment system for a ½D projection system is preferably useful over a broad range of wavelengths. A suitable range of wavelengths for an alignment system may be at least between about the deep UV (about 248 nm) and the "I" line of a mercury arc lamp at about 365 nm, i.e, in the near UV. For greater flexibility the wavelength range should extend to visible wavelengths. An alignment system may share some optical elements of the projection system. A projection system however may be optically corrected for only a narrow band of wavelengths around a specific wavelength. A Half-Field Dyson system, for example, may be corrected only for a band about 6 nm wide around a center wavelength of about 248 nm. Over the range of wavelengths desirable for an alignment system, a Half-Field Dyson system such as system 40 of FIG. 2, may develop spherical aberration, astigmatism and other imagery problems.

For alignment purposes, the numerical aperture of the Half-Field Dyson projection system is restricted to about 0.26, compared with a normal (for wafer photoresist exposure purposes) operating numerical aperture of about 0.7. One way of achieving this restriction is to employ a variable aperture by locating an iris diaphragm in front of primary mirror-lens 30. For alignment, the iris diaphragm would be closed and, for wafer photoresist exposure, it would be opened. Such an arrangement, however, may lead to vibration of the projection system as the diaphragm is opened and closed. This may result in increased time being required between wafer alignment and exposure.

In one embodiment of the present invention a cross-shaped highly reflective coating on the primary mirror of the projection system provides a fixed aperture stop for the alignment system. It is combined with a predetermined arrangement of alignment patterns on a reticle and a wafer, and a corresponding arrangement for illuminating the alignment patterns on the reticle. The combination, which will be described in detail in the next and subsequent paragraphs, is designed to allow wafer photoresist exposure projection operations to be carried out at a relatively large NA and alignment operations to be carried out at a small NA without a mechanical variable aperture system.

Referring now to FIGS. 6a, 6b, 6c, and 6d, one arrangement of alignment keys for a reticle and targets for a wafer to be aligned is illustrated. A reticle includes four pairs of alignment keys 80. The keys may be disposed on the reticle at the corners of a rectangular or square field 77 (See FIG. 6a). The reticle keys 80 are preferably located close to the edge of patterned area 35 of reticle 36 (See FIG. 5). The location of reticle keys 80, i.e the size and shape of field 77 may be selected, for example such that the images of reticle keys 80 projected onto wafer 38 fall on areas of the wafer which will be between the areas on that wafer which will constitute individual circuit chips. These areas are known in the an as "scribe lines". Scribe lines are unprocessed areas left on a wafer such that, after processing, it may be scribed along those lines and broken into individual circuit chips.

Each pair of reticle keys 80 includes a grating-like pattern 81a and a grating-like pattern 81b, each thereof being disposed within a rectangular field and comprising a series of equispaced parallel lines or reflective strips 84a and 84b, respectively, aligned at forty-five degrees (45°) to corresponding sides of its rectangular field. (See FIG. 6c). In grating-like pattern 81a, equispaced lines 84a may be at +45° (referred to as the +45° lines) and in grating-like pattern 81b, equispaced lines 84b may be aligned at −45° (referred to as the −45° lines). As such, the lines 84a of grating-like pattern 81a and the lines 84b of grating-like pattern 81b are oriented perpendicular to each other.

Figure 6A:
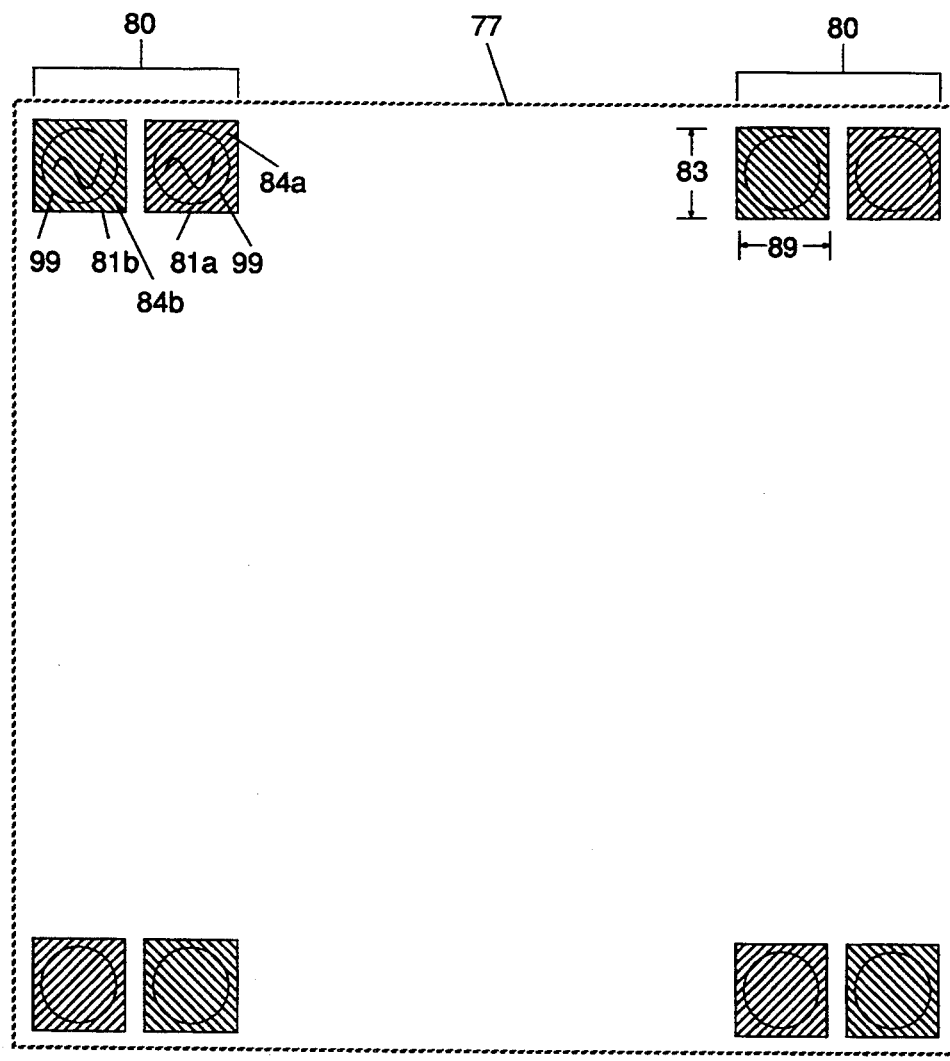
FIG. 6a depicts one form of reticle alignment key pattern according to the present invention.
Figure 6B:
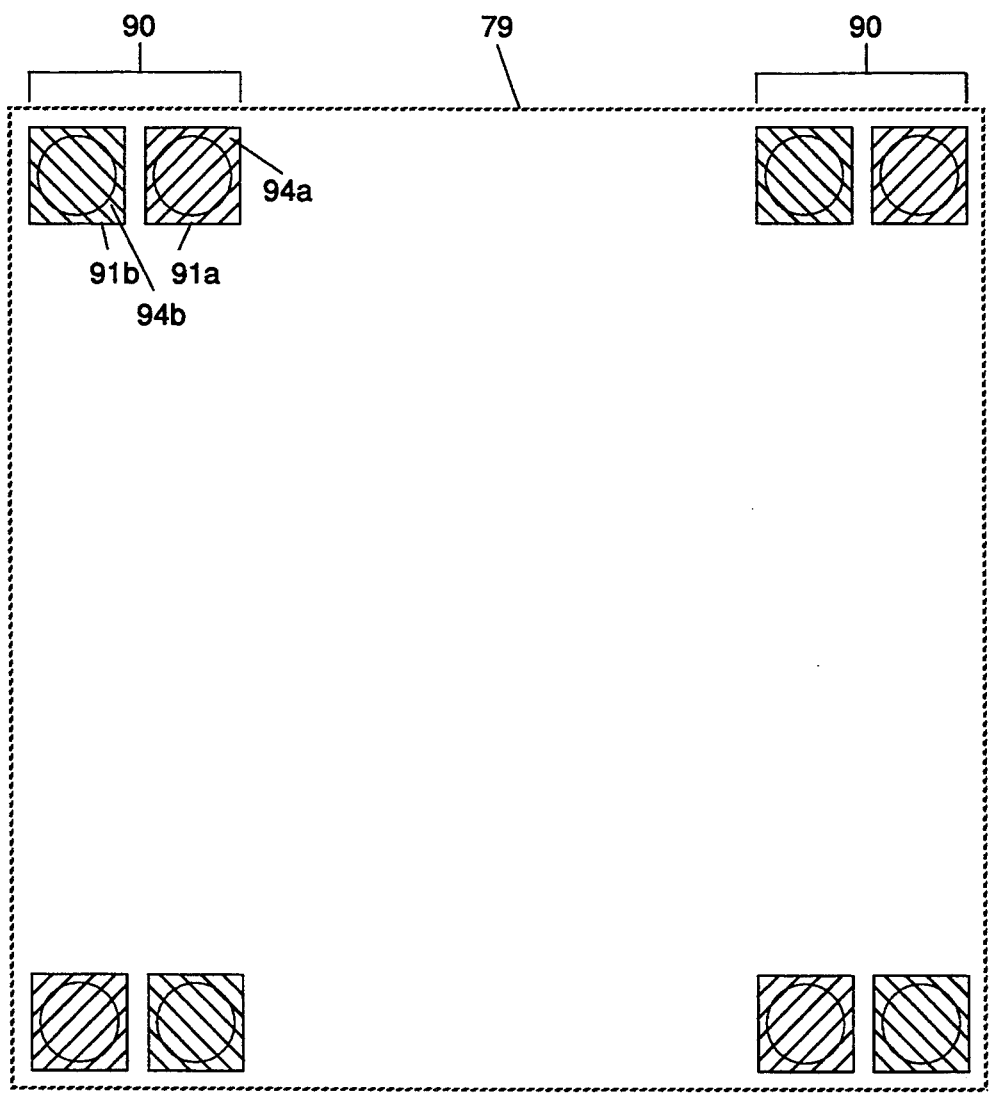
FIG. 6b depicts one form of wafer target pattern according to the present invention.
Figure 6C:
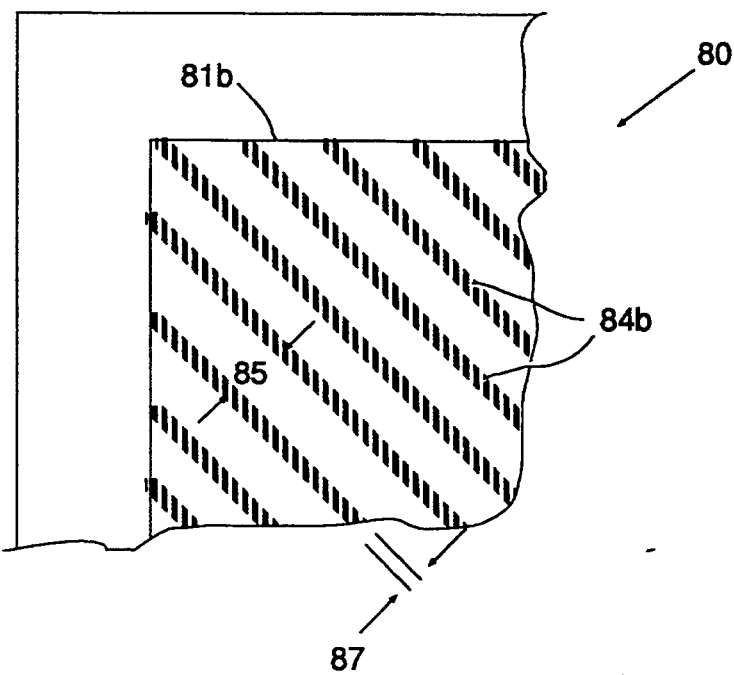
Figure 6D:
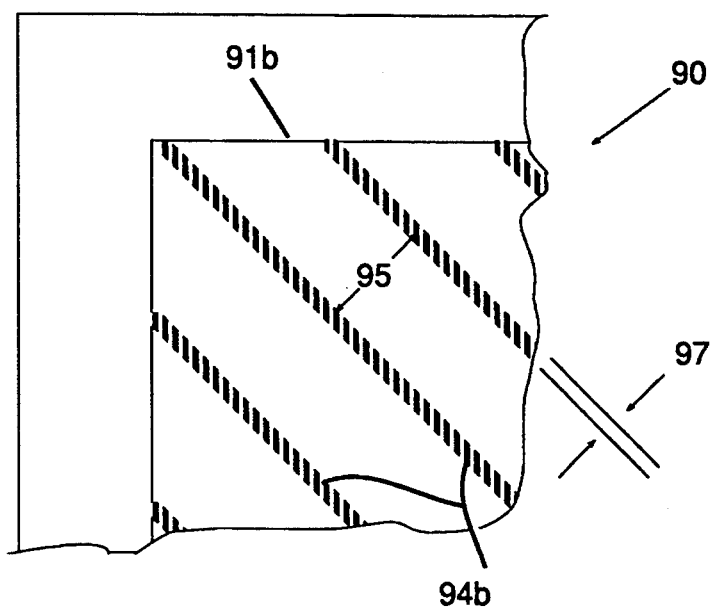
FIG. 6d depicts details of the pattern of FIG. 6b.

A wafer to be aligned with the reticle includes four pairs of alignment targets 90 (See FIG. 6b). These wafer targets 90 are arranged at the corners of a square or rectangular field 79 having the same dimensions as field 77. Each pair of wafer targets 90 includes a grating-like pattern 91a and a grating-like pattern 91b, each thereof being disposed within a rectangular field having essentially the same dimensions as its corresponding reticle key field. Grating-like pattern 91a comprises parallel equispaced +45° lines 94a and grating-like pattern 91b comprises parallel equispaced −45° lines 94b (See FIG. 6d). Lines 94a and 94b may be in the form of either raised portions or depressions on the wafer surface. Lines 84a (shown in FIG. 6a) have the same spacing 85 and the same line width 87 as lines 84b (See detail area in FIG. 6c). Lines 94a (shown in FIG. 6b) have the same spacing 95 and the same line width 97 as lines 94b (See detail area in FIG. 6d). Spacing 95 of the wafer target is arranged to be twice spacing 85 of the reticle key (See FIGS. 6c and 6d). As shown in FIG. 6a, the rectangular fields of each of the reticle and wafer grating-like patterns may have a length 83 of about 70 micrometers (microns) and a width 89 of about 80 microns. For alignment using light having wavelengths between deep and near UV, line spacing 85 may be about 4.4 microns and line width 87 may be about 1.1 or 1.4 microns. For aligning with visible light wavelengths, spacing 85 may be about 7.0 microns and line width 87 may be about 1.8 microns.

In one embodiment of the invention an illumination arrangement for reticle alignment keys is configured such that illumination is provided only on generally circular areas 99 on patterns 81a and 81b. For a rectangular field 82 having dimensions of about 70 microns by 80 microns, circular area 99 may have a diameter of about 65 microns.

Figure 7:
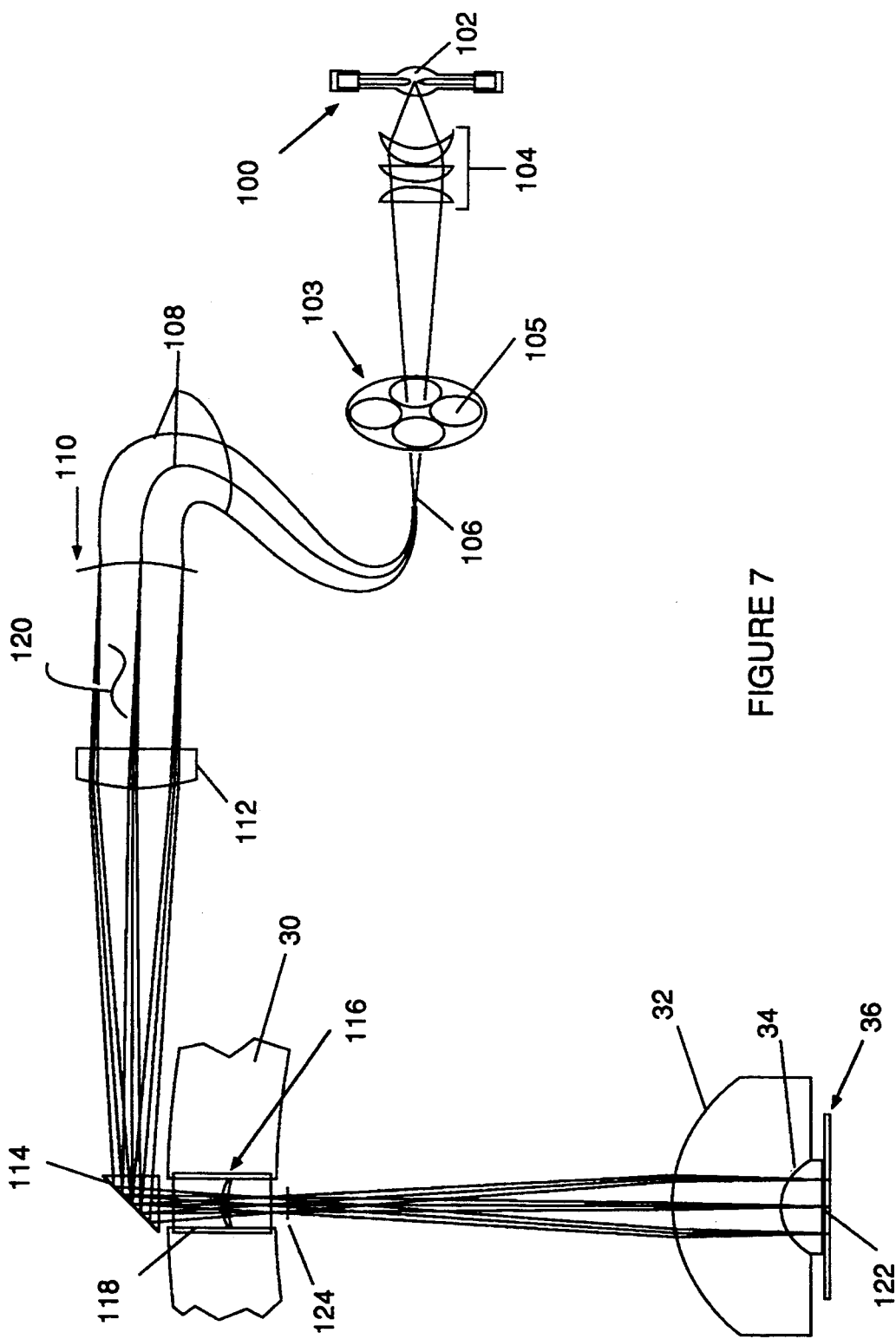
FIG. 7 depicts a system for illuminating the alignment patterns of FIG. 6.

Referring now to FIG. 7, an illumination system for providing circular areas 99 is shown. This system includes a light source 100, for example, a one-hundred watt mercury lamp which provides a ball shaped intense plasma at position 102. A condenser lens 104 focuses light from plasma 102 onto a bundle 106 of eight optical fibers. A filter wheel 103 located between condenser lens 104 and fiber bundle 106 includes a plurality of optical filters 105 any of which may be placed in the path of light from light source 100. The filters 105 may be narrow band filters for isolating specific spectral lines from the output of light source 100 or broad bandpass filters for isolating a wider band of wavelengths from a continuous spectrum of light source 100.

The fiber bundle 106 is separated into fiber pairs 108. Fiber pairs 108 may be held and positioned by mechanical flexures or stages (not shown) such that they may be arranged in an orthogonal pattern corresponding to the pattern of keys 80 (See FIG. 6). The fiber pairs 108 are positioned in a curved plane 110 corresponding to a focal plane of an optical relay system including a lens element 112, a fold prism 114 and a color corrected lens 116. Color corrected lens 116 is located in a hole 118 in projection system mirror lens 30 (See FIG. 4). Color corrected lens 116 may be an air spaced doublet lens including a positive calcium fluoride element and a negative fused silica element. The combination of doublet lens 116 and lens 114 produces a relay system which is telocentric in object space 120 and image space 122. The relay system may be arranged to have an alignment illumination pupil 124 coinciding with front surface 61 of projection system primary mirror-lens 30. The alignment illumination pupil 124 may have a diameter corresponding to a system NA of about 0.030. The magnification of the relay system is chosen to provide the desired diameter of circular areas 99 (See FIGS. 6a and 6b).

Figure 8B:
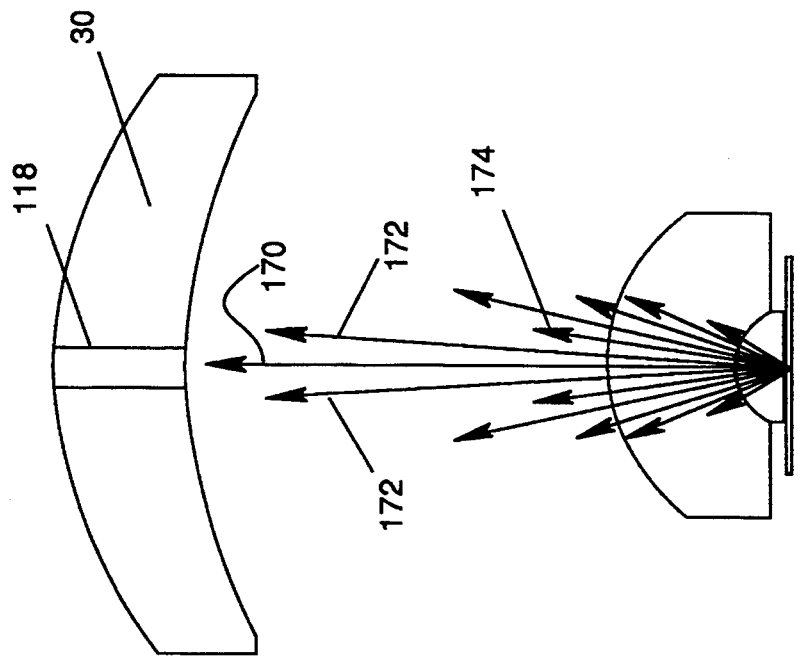
FIG. 8b depicts diffraction of light from the wafer targets of FIG. 6b.
Figure 8A:
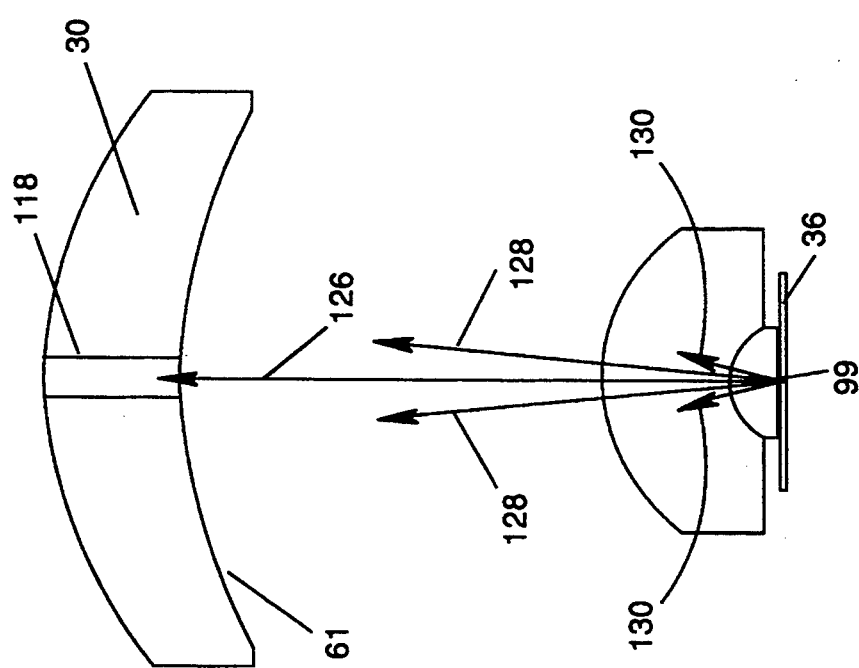
Figure 9:
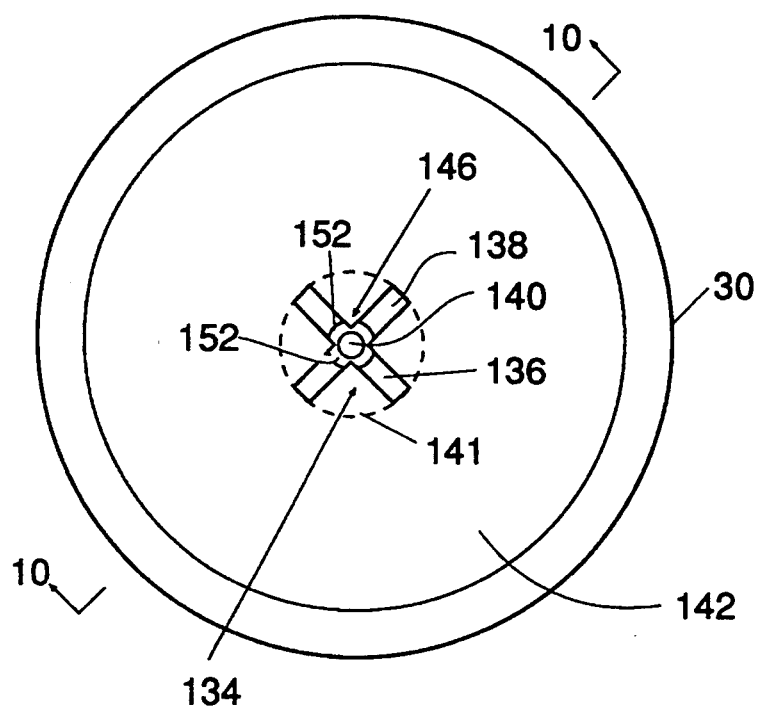
FIG. 9 depicts one form of an aperture stop for an alignment system according to the present invention.

Referring now to FIGS. 8a, 8b and 9 the function of reticle patterns 81a and 81b will be explained, and the form of a pupil stop for the alignment portion of the projection system will be described.

It will be evident to those familiar with the art, that the equispaced lines 84a and 84b of grating-like patterns 81a and 81b of key pair 80 will function as diffraction gratings. As such, light from circular areas 99 will be diffracted, as illustrated in FIG. 8a, into a zero order 126, plus and minus first orders 128, plus and minus second orders 130, and plus and minus higher orders (not shown). The zero diffracted order 126 is redirected back through hole 118 in the system primary.

The diffracted orders higher than zero from any given grating-like pattern will provide a series of light patches on surface 61 lying in a straight line (not shown) extending from the center of projection system mirror-lens 30. As equispaced lines 84a of grating-like pattern 81a are arranged at right angles to the equispaced lines 84a of grating-like pattern 81a, diffracted orders from all four pairs of alignment keys 80 on reticle 36 will provide a series of light patches in the form of a cross at surface 61 of projection system mirror-lens 30.

Figure 10:
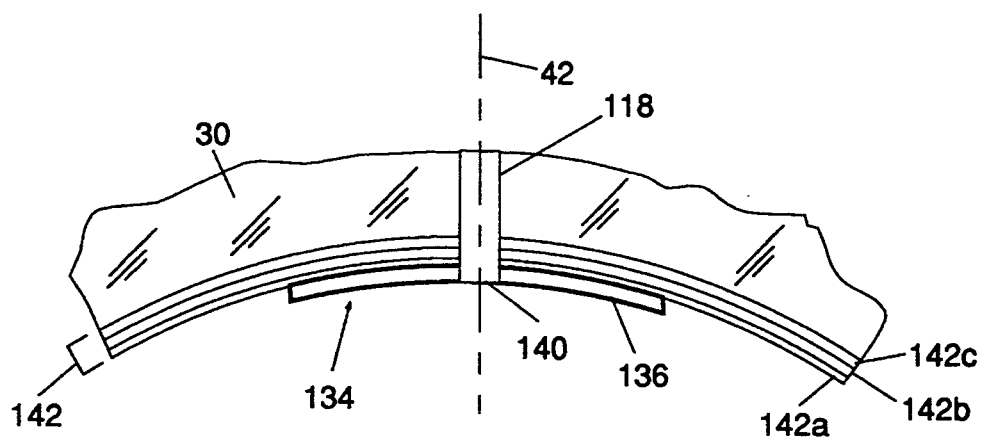
FIG. 10 depicts a cross section taken in the direction 10—10 of FIG. 9 showing details of the aperture stop and a three layer dielectric coating.
Figure 11:
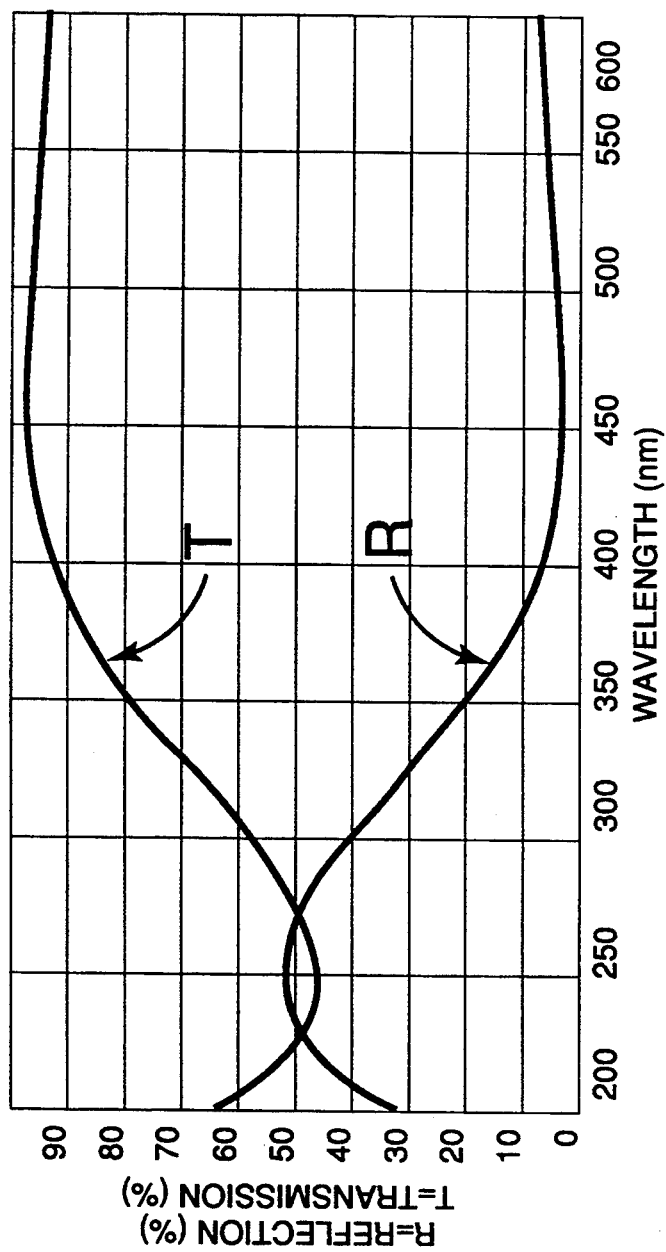
FIG. 11 graphically depicts the reflection and transmission as a function of wavelength of one form of the dielectric coating of FIG. 10.

Referring now to FIGS. 9, 10 and 11 an arrangement of a projection system pupil stop 134 for the diffracted orders higher than zero reflected from the alignment keys is shown. The pupil stop 134 includes reflective strips 136 and 138 arranged generally at fight angles to each other in the form of a cross. The cross is oriented to align with the directions of light diffracted from reticle keys 80. An aperture 140 is provided at the intersection of strips 136 and 138 for allowing transmission of alignment illumination into the projection system. The hole 140 provides a pupil stop for alignment illumination and has a diameter corresponding to a system NA of about 0.03. The reflective strip stop forms a reflector for alignment illumination diffracted from reticle keys 80, which as described above, takes the form of a plurality of diffracted beams in the form of a cross. The reflective strips 136 and 138 of stop 134 extend across the diameter of system mirror-lens 30 to a point 141 which lies on the diameter of a circle equivalent to a system NA of 0.26.

As discussed above mirror-lens 30 is preferably coated with a multilayer dielectric coating. The coating may provide about 50% reflection and 50% transmission of light at a wavelength of about 248 nm. Such a dielectric coating 142 may comprise three layers including two high refractive index layers 142a and 142c having a low refractive index layer 142b therebetween (See FIG. 10). A characteristic of such a coating is that the highest reflection may be obtained only at a relatively narrow band of wavelengths. Wavelengths outside this narrow band are generally reflected less and transmitted more at wavelengths increasingly remote from the narrow band.

FIG. 11 shows the computed reflection (Curve R) and transmission (Curve T) of such a coating including two hafnium oxide layers and an intermediate fused silica layer. At 248 nm reflection is about 51% and transmission is about 46%. At the mercury "I" line, i.e. 365 nm, reflection may be less than twenty percent and transmission greater than 80%. At visible wavelengths reflection may be less than about 5% percent and transmission may be above 90%. In a simple and convenient form aperture stop 134 may be formed from a cross-shaped aluminum layer deposited on system primary minor-lens 30 (See FIG. 10). An aluminum layer having a thickness of about 200 nm is highly reflective at visible and UV wavelengths. As such, all visible and UV wavelengths will be highly reflected by stop 134. Diffracted orders of alignment illumination falling on system primary mirror-lens 30 beyond stop 134 will be substantially transmitted by coating 142. The convenient arrangement of stop 134 is facilitated by the particular arrangement of reticle keys. It enables a fixed stop having an effective system NA of 0.26 to be positioned in front of a projection system primary having a NA of about 0.7 without causing significant obscuration of the projection system when it is used for deep UV imagery.

Alignment illumination diffracted from reticle keys 80 and reflected from alignment stop 134 will be imaged, as a pattern of equispaced lines in a dark field on targets 90. A wafer will be correctly aligned when images of all reticle keys 80 are aligned with corresponding wafer targets 90. As such when the wafer is aligned a maximum amount of light may be diffracted by grating-like patterns patterns 91a and 91b of wafer targets 90, the light will be diffracted in orthogonally (perpendicularly) oriented zones. At any stage of misalignment, less than the maximum light may be diffracted. Collecting and measuring the intensity of light diffracted into the plus and minus first orders from the wafer targets provides a means for computing the degree of misalignment and generating a correction signal therefrom. The signal may be used, for example, for driving a wafer alignment stage.

Figure 12A:
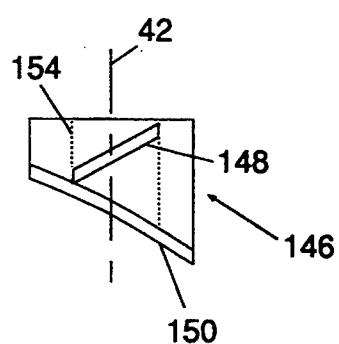
FIG. 12a depicts a side elevation view of the pick up assembly taken in the direction 12a—12a of FIG. 12.
Figure 12:
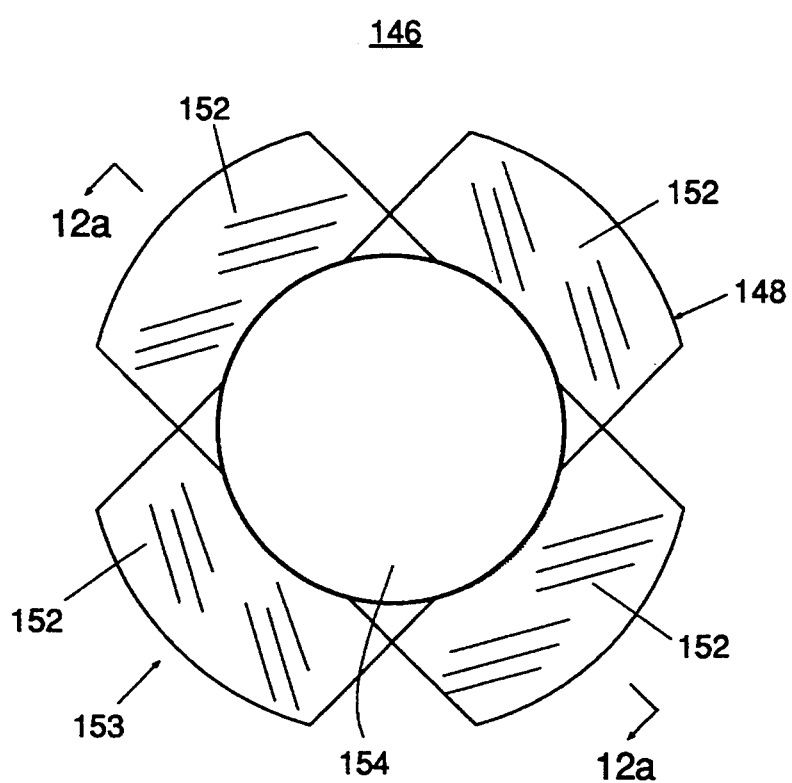
FIG. 12 depicts a plan view of one form of an image relay assembly for collecting light diffracted from alignment targets on the wafer as shown in FIG. 8b.

Referring now to FIG. 12, one pan of an image relay called the pick up assembly 146, for receiving light diffracted from wafer targets 90 and directing it to a measurement system is shown. The pick up assembly 146 includes two elongated spherical mirrors 148 and 150 arranged in the form of a cross having four spherical surfaces 152 surrounding an aperture 154 extending through both mirrors. Pick up assembly 146 may be mounted in front of system primary mirror 30 (See FIGS. 9 and 13), with aperture 154 aligned with aperture 140 of stop 134 (and hole 118). Spherical mirrors 148 and 150 are arranged to direct light diffracted from wafer targets 90 out of the Half-Field Dyson projection system into an optical system for monitoring and measurement to provide alignment information.

Figure 13:
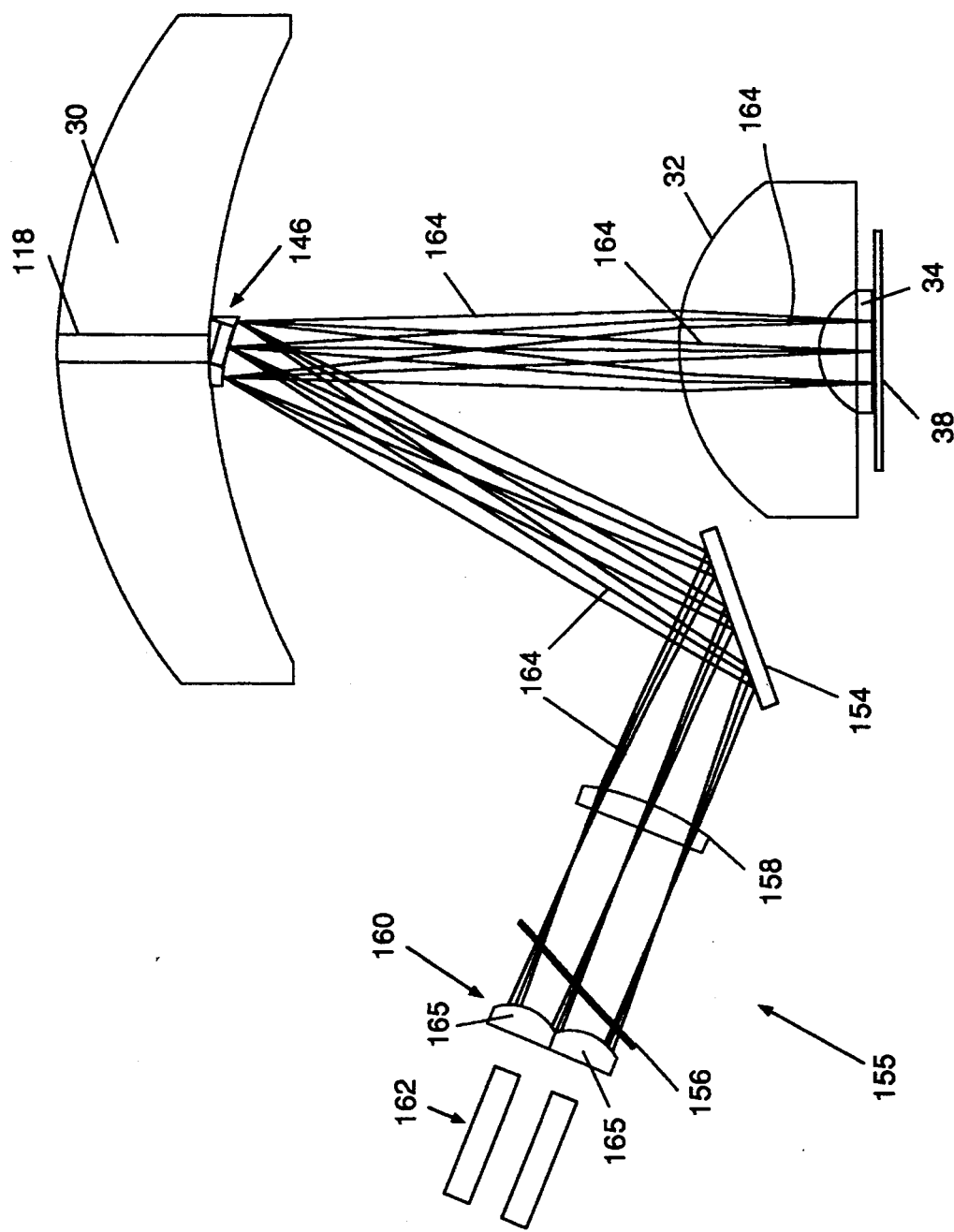
FIG. 13 depicts one of two units of one embodiment of a normal incidence alignment system according to the present invention.

Referring to FIG. 13 one form of an optical system for monitoring and measurement of the diffracted light includes two units 155 (only one of which is shown for clarity). The two units 155 are located generally symmetrically and diametrically opposite each other about system optical axis 42. Pick up mirrors 148 and 150 are tilted in opposite directions as illustrated in FIG. 12a such that diffracted orders from all +45° pattern lines of grating targets 90 are directed to one unit 155 and diffracted orders from all −45° lines are directed to the other unit 155 (not shown).

Referring again to FIG. 13, light is directed by image pick-up assembly 146 out of the Half-Field Dyson projection system onto a fold mirror 154, then via a lens 158 and a blocker 156 to quadrant lenses 160 and detectors 162, for example photomultipliers.

Referring now to FIGS. 8a and 8b, the form of diffracted alignment illumination from reticle keys 80 (FIG. 8a) and wafer targets 90 FIG. (8b) is shown. As wafer targets 90 have a line spacing twice the line spacing of reticle keys 80, first orders 128 diffracted from reticle keys 80 will be diffracted at an angle twice as great as first orders 172 diffracted from wafer targets 90. As such the aperture of image relay assembly 146 (as defined, for example, by a circle surrounding mirror extremities 153 shown in FIG. 12) is preferably selected such that surfaces 152 will only pick up wafer target first diffraction orders 172 while allowing reticle key first diffraction orders 128 to be reflected from stop 134 and imaged onto wafer targets 90 by the Half-Field Dyson projection system. As such, relay minor surfaces 152 have a minimum effective NA of about 0.030 and a maximum effective NA of about 0.068.

Referring again to FIG. 13, beams 164 represent light imaged from reticle keys 80 and diffracted from wafer targets 90. At least some portion of the diffracted light is collected by tilted spherical mirror surfaces 152 (See FIG. 12) of pick-up assembly 146 and directed to a fold mirror 154. The fold mirror 154 directs beams 164 to field lens 158 which collects beams 164 and forms an astigmatic image behind lens 158. Beams 164 are transmitted past one side of a blocker 156 which is tilted relative to the direction of propagation of the beams. The inclination of blocker 156 is such that its surface is in a plane corresponding to the best image of dividing line 57 between reticle field 53 and wafer field 55 (See FIG. 3a). As such, only light diffracted from wafer targets, i.e. beams 164, is transmitted past blocker 156. Any light which may come directly from reticle keys 80 is blocked and is not transmitted.

Behind blocker 156 an array 160 of four lenses 165 is provided. The four lenses 165 are arranged so that an image of the wafer field is divided into quadrants by the array. Light in each quadrant is then monitored by a separate photo-multiplier 162. Light diffracted from each of grating-like patterns 91a (or, alternatively, grating-like patterns 91b) of the four separate targets 90 located at each corner of wafer field 79 (See FIG. 6b) is located in a different quadrant. Therefore, each wafer target 90 has a photo-multiplier for measuring light diffracted therefrom. As previously discussed, preferably the +45° patterns (i.e., grating-like patterns 91a) from all four targets are monitored by one system 155 and −45° patterns (i.e., grating-like patterns 91b) from all four targets are monitored by another system 155 (not shown). As such, when wafer 38 is moved (scanned) with respect to reticle 36 for alignment therewith, eight separate signals are generated by photomultipliers 162. As previously discussed, most light is detected and thus the peak signal is generated when a reticle key image is correctly aligned with its corresponding wafer target.

In one arrangement of reticle keys 80, all may have the same line spacing (grating period) 85. This arrangement however will only indicate alignment unambiguously over a narrow range determined by the pattern (grating) spacing 85. The unambiguous range may be between about 1.1 and 1.6 microns. In this arrangement, a large error in alignment, for example the misalignment of patterns in the X or Y directions by a grating period, may be mistaken for correct alignment.

In one preferred arrangement, reticle keys 80 and wafer targets 90 at the top of a field may be provided with patterns having different line spacings and line widths from reticle keys 80 and wafer targets 90 at the bottom of the field. This provides a means for extending the unambiguous range.

Figure 14:
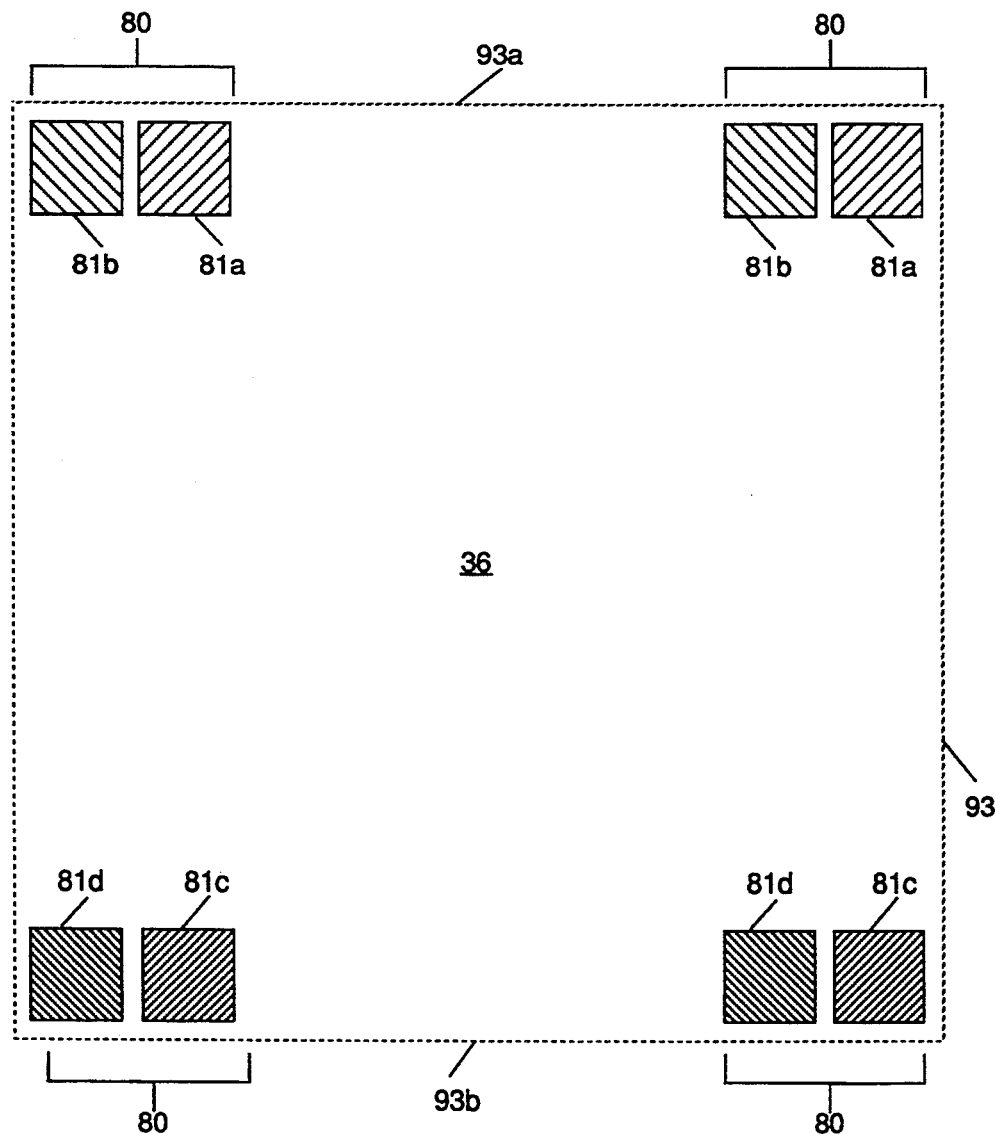
FIG. 14 depicts an arrangement of reticle key patterns having different line spacings.

Referring now to FIG. 14, reticle keys 80 may be arranged on reticle 36 in the corners of a rectangular field designated by dotted line 93. At top edge 93a the reticle keys may have +45° and −45° patterns 81a and 81b having a first line spacing and a first width. At bottom edge 93b, reticle key patterns 81c and 81d may have a second line spacing and a second line width.

The wafer 38 (See FIG. 5) must be provided with targets having twice the line spacing of corresponding patterns on reticle 36 (See FIG. 5). Line spacings for patterns 81a and 81b and 81c and 81d may be selected such that if patterns at top edge 93a are aligned, in the sense that lines are superimposed, with corresponding patterns on wafer 38, but displaced by one or more line widths, then lines on patterns 81c and 81d cannot be superimposed with corresponding lines on wafer 38. As such, a means of resolving a potential ambiguity is provided. Further, if line spacings are correctly selected, there may be a relatively small probability that both top edge patterns and bottom edge patterns will ever be misaligned without the error being detected.

The spacing of the lines in a reticle key is optimally chosen such that the first and second diffraction orders therefrom fall on reflective strip stop 134 on primary mirror-lens 30, (i.e., in a range of numerical aperture between about 0.063 and 0.26). The spacing of lines in a corresponding wafer target must be double the spacing of lines in the reticle key, such that first order diffraction is collected by relay mirrors 152, (i.e., in a range of numerical aperture between about 0.03 and 0.063).

Generally, illumination of longer wavelengths requires greater line spacings, and greater line widths for reticle key patterns, thus increasing the unambiguous range for alignment. The difference in alignment pattern spacing used in a particular wavelength range may be selected such that an indication of misalignment due to an ambiguity error between alignment of top edge 93a and bottom edge 93b may not be confused with a "run-out" error, i.e. a difference in scale between a wafer pattern and the image of the corresponding reticle pattern.

Generally, two completely different sets of alignment targets and keys will be necessary to cover a wavelength range between about 248 nm and 700 nm. Such a broad band of wavelengths, including UV and visible wavelengths, may be provided, for example, by a using both a xenon lamp and a mercury lamp as a light source 100. These two sources could provide illumination spanning a range between about 248 nm and 700 nm. In such a case two separate sets of targets would be necessary, a first set for coveting a range between about 248 nm and 365 nm and a second set for coveting a range between about 365 nm and 700 nm. As discussed above, it is important to ensure that the second order diffraction from the longest wavelength in any range selected, and the shortest reticle key line spacing selected, will be diffracted such that it falls within a projection system NA of about 0.26, i.e., falls on cross-shaped reflective stop 134. Similarly, first order diffraction from the shortest wavelength and the largest grating spacing on the wafer target selected should, preferably, fall on surfaces 152 of pick-up assembly 146, i.e., between a system NA of about 0.063 and 0.030. Based on the foregoing general guidelines reticle key line spacings 85 (See FIG. 6d) may be between about 3.8 microns and 8.8 microns and line widths 87 may be between about 0.25 and 0.31 of the smallest line spacing selected.

For the alignment system described above, the alignment illumination is normally incident on the reticle, and the illumination returning from the wafer is collected by mirrors 152 of pick up assembly 146 at nearly normal incidence. As such, the alignment system may be referred to as a near normal incidence system.

Since the alignment targets contain only plus and minus 45 degree lines (diffraction edges), both X and Y misalignment components may be measured by simply scanning in X rather than in both X and Y. With four targets X, Y, theta (rotational misalignment), and other information including magnification differences between the reticle and wafer patterns, may be computed from signals generated by photomultipliers 162 (See FIGS. 13 and 17).

While the near normal incidence alignment system of FIG. 13 may be useful in most alignment situations, it may provide jagged or noisy alignment signals in some situations such as may be encountered when aligning a wafer having several layers of metallization. In such situations a complementary alignment system is particularly useful in providing less noisy signals than the near normal incidence system.

Figure 15:
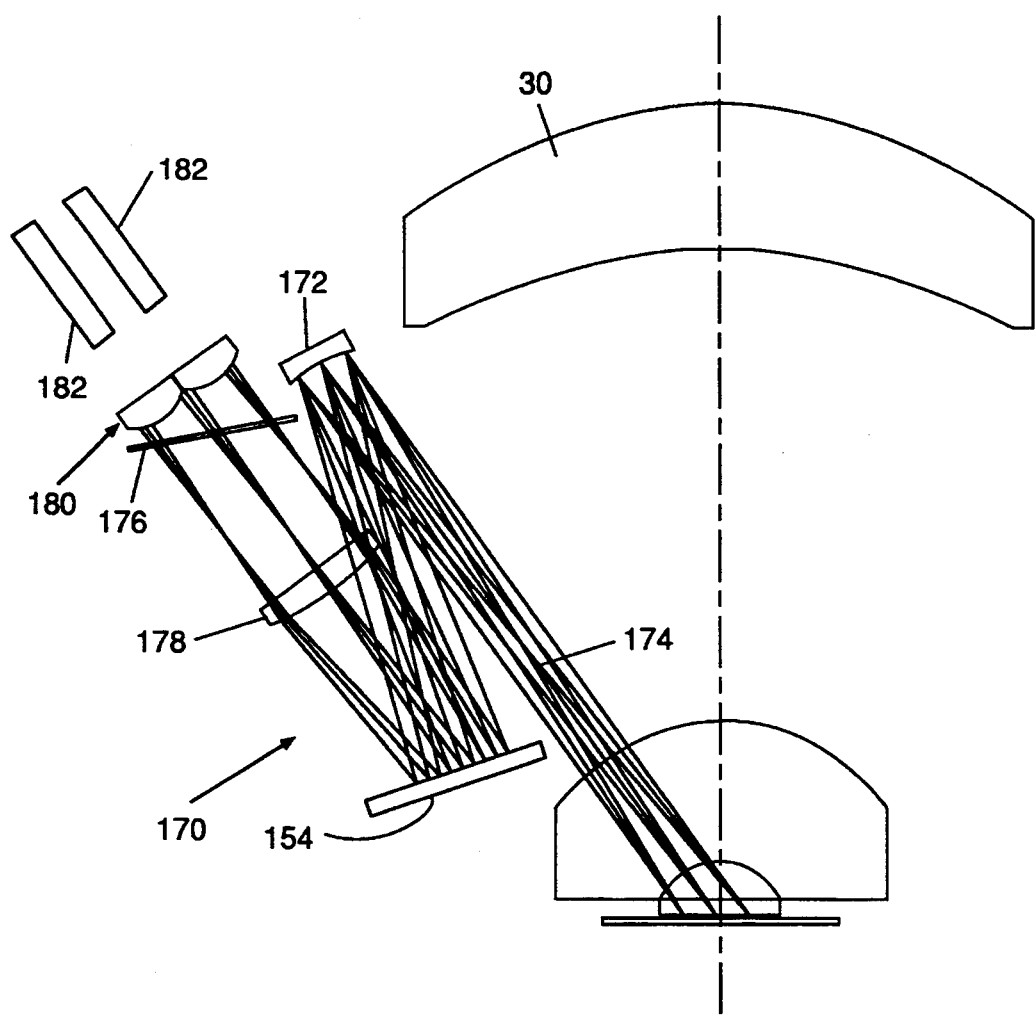
FIG. 15 depicts one of four sections of one embodiment of a glancing incidence alignment system according to the present invention.

In one embodiment, a complementary alignment system may take the form of a glancing incidence alignment system illustrated in FIG. 15. The glancing incidence alignment system is conceptually similar to the above-described normal incidence system. It may use the same illumination system, shown in FIG. 7, as the normal incidence alignment system of FIG. 13, including filter wheel 103 for selecting an alignment wavelength, and reflective reticle stop 134 for limiting its effective aperture. The system is arranged to collect light which is diffracted from wafer targets 90 into high diffraction orders which leave the wafer at an angle sufficiently large such that they fall outside the aperture of system primary mirror-lens 30. For this reason, the complementary system may be referred to as a glancing incidence alignment system.

One of four identical sections 170 of a glancing angle alignment system is illustrated in FIG. 15. Sections 170 are generally equispaced around the optical axis of the Half-Field Dyson projection system such that they may collect and measure light diffracted from wafer targets 90. For the glancing angle system, a portion of the light diffracted in the higher orders from wafer targets 90 is collected from four (one per section) tilted mirrors 172 located outside the aperture of primary minor-lens 30. Although the light passes through the projection lenses at about a 45 degree angle, it is actually diffracted by the wafer at much higher (glancing) angles which are reduced to about 45 degrees by the refractive effect of the glass in lens elements 32 and 34. The tilted mirror 172 reflects light on to fold minor 154 of the normal incidence alignment system. The light is reflected by the fold minor 154 onto a field lens 178 located above field lens 158 of normal incidence alignment system unit 155

(See FIG. 13). The glancing angle system also has a blocker 176 which is tilted, but shown out of its preferred plane for clarity. A suitable inclination plane for blocker 176 may be determined by the criteria described above for selecting an inclination plane for alignment system blocker 156. Light directed past blocker 176 is divided into quadrants by four separate field lenses 180 (only two of which are visible in FIG. 15 as the other two are obscured by the two that are visible) which are butted together. Each quadrant is imaged on a separate photo-multiplier tube 182. As discussed section 170 is one of four sections of a glancing angle alignment system. The sections 170 are generally equispaced around axis 42 of the ½D projection system.

The above described glancing angle alignment system includes 16 photomultiplier tubes 182, four for each of four channels. As such, sixteen signals are available for providing alignment information. The glancing angle alignment system can operate simultaneously with the above described normal angle alignment system. Signal comparisons between the two systems may be used to determine which of the two is likely to provide the most accurate alignment, and operation of the system may vary accordingly.

Figure 16:
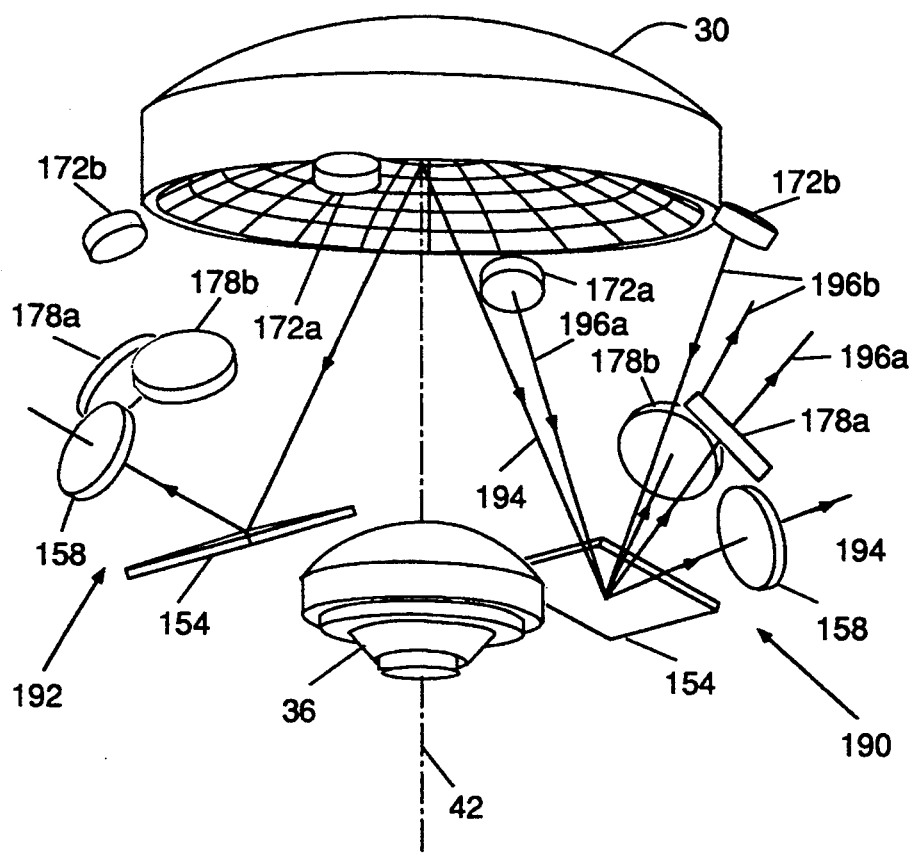
FIG. 16 schematically depicts one arrangement of optical elements of the alignment systems of FIGS. 13 and 15 and optical elements of the Half-Field Dyson projection system of FIG. 2.

Referring now to FIG. 16, one arrangement for grouping the normal incidence and glancing incidence alignment systems with the Half-Field Dyson projection system is illustrated. For clarity, only certain elements of the system are shown. Comparison with the more detailed descriptions of each of the systems given above may be used to indicate where remaining elements in the systems are located. Light paths through glancing incidence and normal incidence alignment system components are represented by single lines. Two groups of elements 190 and 192 are shown, each group includes two field lenses 178a and 178b of the glancing alignment system, a field lens 158 of a unit of the normal incidence alignment system, and a fold mirror 154 common to both the normal incidence and glancing incidence alignment systems. Two adjacent collection mirrors 172a and 172b of the glancing incidence alignment system share a common fold mirror 154. Referring to element group 190, a diffracted beam 194 of the normal incidence alignment system, is directed by pick up mirror segments 152 (not shown) onto fold mirror 154 and through field lens 158. A diffracted beam 196a from the glancing incidence alignment system is directed by collecting mirror 172a onto fold mirror 154 and through field lens 178a. A diffracted beam 196b from the glancing incidence alignment system is directed by collecting mirror 172b onto fold mirror 154 and through field lens 178b.

Figure 17:
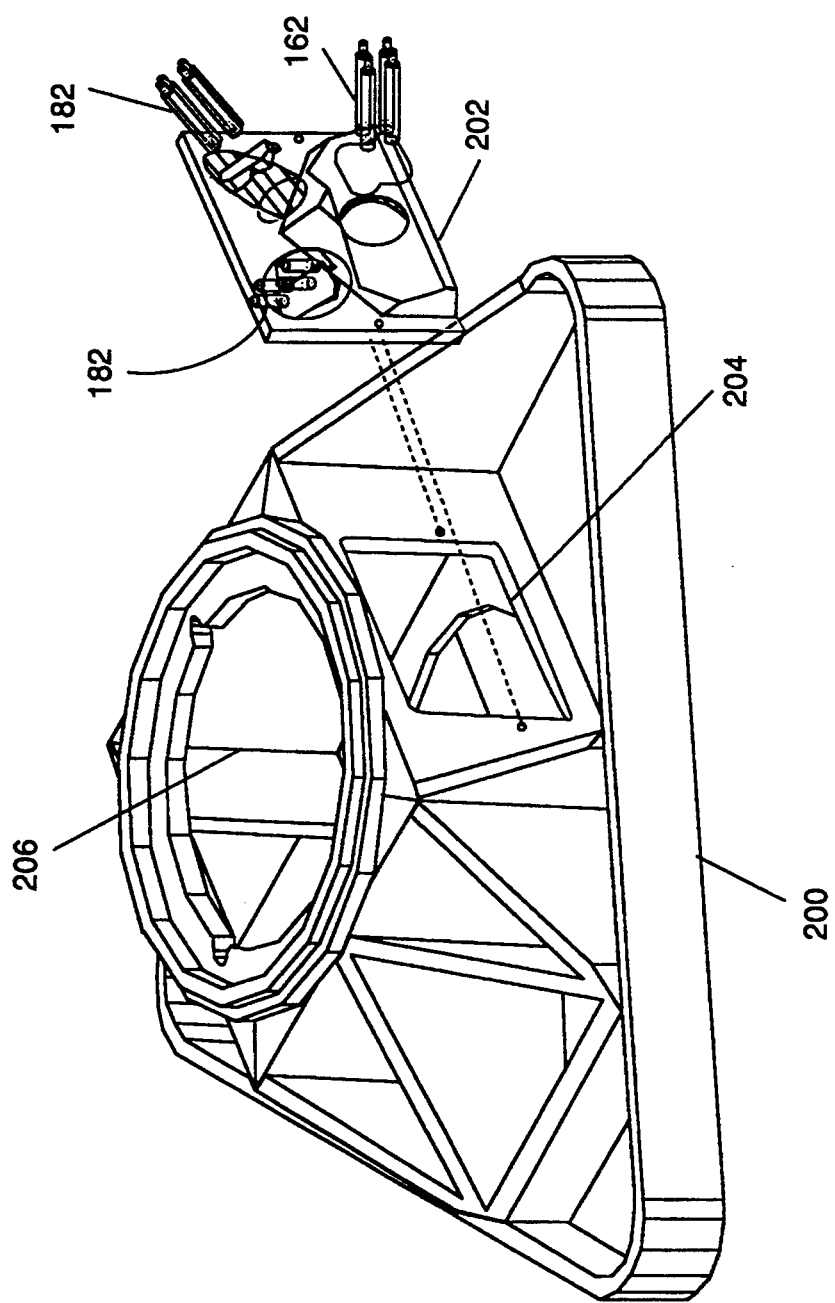
FIG. 17 depicts a housing for mounting optical elements shown in FIG. 16

Referring to FIG. 17, one form of a lens housing for holding elements of a Half-Field Dyson projection system and elements of its alignment is illustrated. Housing 200 includes an opening 204 for mounting a detector assembly 202. Detector assembly 202 includes eight photomultipliers 182 arranged in two groups of four for measuring light from the glancing incidence alignment system in paths 196a and 196b (See FIG. 16), and four photomultipliers 162 for measuring light from the normal incidence system in path 194. A similar detector assembly may be mounted in opening 206.

One embodiment of a mechanical arrangement for positioning a reticle and wafer will now be described.

Figure 18:
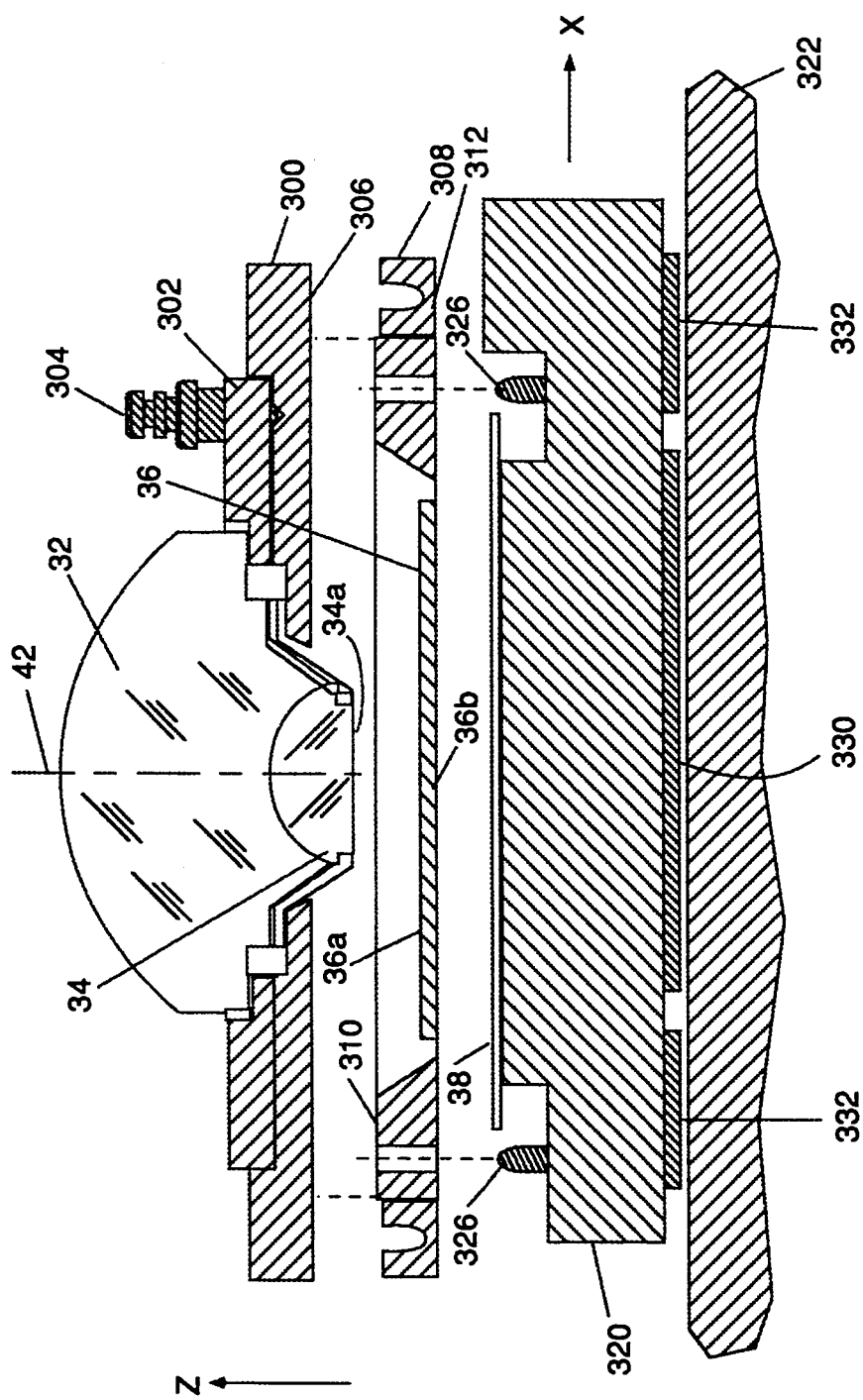
FIG. 18 depicts an exploded view illustrating components of reticle and wafer stages for the projection system of FIG. 2.

Referring now to FIG. 18, an enlarged, exploded cross section view of the mechanical arrangement is illustrated. Components of the arrangement include a lens mount plate 300 having a lower surface 306, a mount 302 for negative lens 32, and a micrometer adjustment screw 304 for aligning negative lens 32 with positive lens 34. Other components include a reticle stage 308 having an upper surface 310 and a lower surface 312. The lower surface 306 of plate 300 is preferably a lapped surface. A wafer or X-Y stage 320 is supported on air bearings (not shown) above a platen 322. Wafer stage 320 has air bearings so it can slide essentially friction free across platen 322. Mask stage 308 includes magnets and air bearings (not shown) so it can slide essentially friction free across lapped surface 306 of lens mount plate 300.

When the above described components are assembled with surface 306 in contact with surface 310, there is a gap of about 93 microns between top surface 36a of reticle 36 and bottom 34a of positive lens 34, and a gap of about 150 microns between the bottom 36b of reticle 36 and top surface 38a of wafer 38. The reticle 36 is suspended at three points near its edge and may be laterally positioned by moving reticle stage 308 across lapped bottom surface 306 of lens mount plate 300. Movement is facilitated by activating air bearings (not shown) within reticle stage 308. Magnetic attraction may be used to load the air bearings and keep reticle stage 308 against lens mount plate 300.

Once reticle stage 308 has been correctly positioned, the air bearings may be deactivated, allowing the magnetic attraction to clamp reticle stage 308 to surface 306 of lens mount 300.

Figure 19:
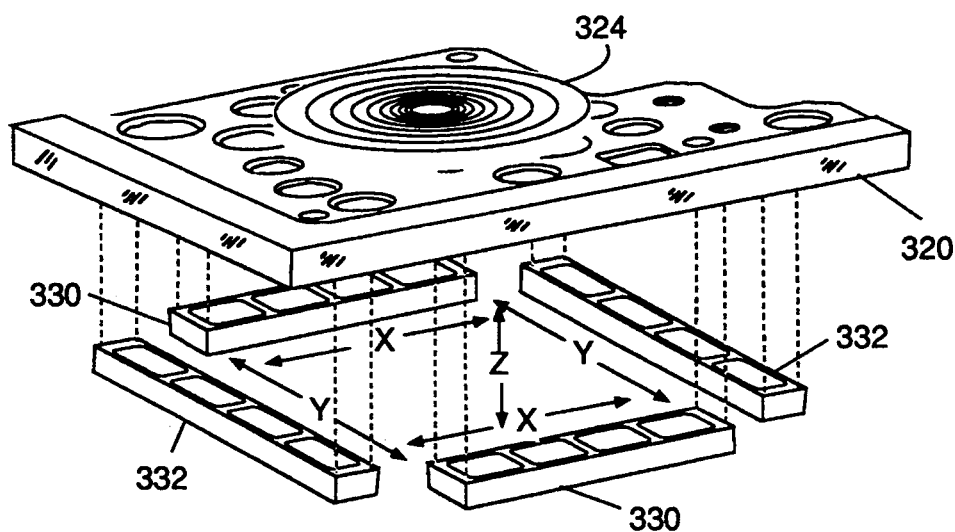
FIG. 19 depicts a wafer stage which may be used to position the reticle stage shown in FIG. 18.
Figure 20:
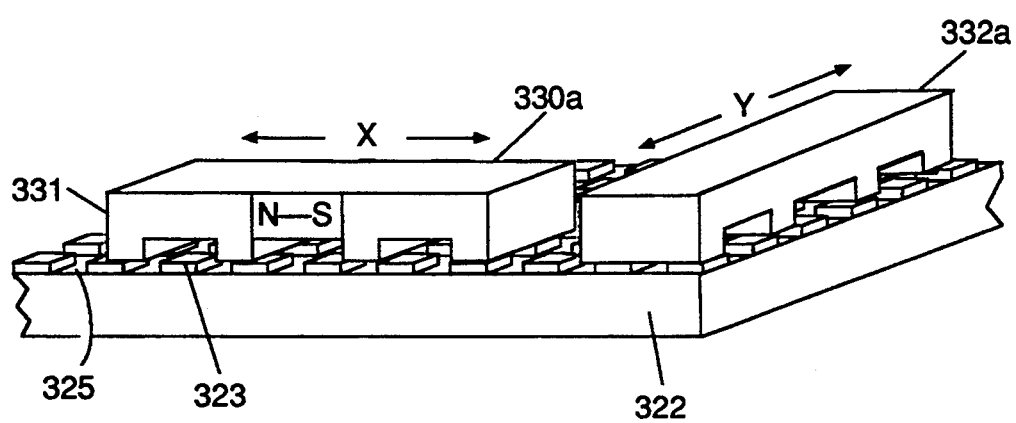
FIG. 20 depicts details of one form of a platen and linear motor armature for supporting and moving the wafer stage of FIG. 19.

Movement of the wafer and reticle stages may be accomplished by a drive arrangement including linear magnetic motors. One such arrangement is illustrated in FIGS. 18, 19, and 20. Here, linear motors 330 and 332 may be arranged generally in the form of a rectangle and coupled to wafer stage 320. Wafer stage 320 is preferably made from a light, stiff material such as "Zerodur", a low expansion ceramic material obtainable from Schott of Duryea, Pa.

Linear motors 330 drive in the X direction and linear motors 332 drive in the Y direction. Pole pieces 331 of motor segments 330a and 332a magnetically couple with studs or facets 323 formed on a steel platen 322. Spaces 325 between facets 323 may be filled with a non-magnetic, castable material, for example, an epoxy resin, such that a continuous flat surface is formed for compatibility with air bearing supports. Motors on opposite sides of the stage may be driven in opposite directions to provide rotational (theta) motion of wafer stage 320. Wafer stage 320 is supported above platen 320 by air bearings (not shown). Wafer stage 320 also includes three actuators (not shown) which act in a vertical direction, i.e., in the direction Z shown in FIG. 18.

Vertical operation of the actuators provides means for focusing an image of reticle pattern 36 on wafer 38 including tilting wafer 38 about the X or Y axis for aligning it parallel to reticle 36. A total of four linear drive motors and three vertical actuators thus provides a total of six degrees of freedom of movement for wafer stage 320.

In a typical operational sequence, reticle 36 may be loaded in reticle stage 308, wherein it may be supported by three points about its edge. The reticle stage may be coupled to wafer stage 320 by pop up pins 326 located thereon (See FIG. 18). Using the above-described drive arrangement for wafer stage 320, reticle stage 308 may be accurately positioned and clamped. Wafer stage 320 may then uncoupled from reticle stage 308 and the drive system used to align wafer 38 with reticle 36. As such, a separate drive system is not required for reticle stage 308.

An alignment system for a Half-Field Dyson projection system has been described. Useful features of the invention include the use of reticle keys and wafer targets having equispaced parallel lines acting as diffraction gratings. As such, light diffracted from the reticle keys and wafer targets may be directed in to narrow perpendicularly opposed zones. This permits a fixed reflective aperture stop for the alignment system to be positioned on the primary mirror without creating significant obscuration of the projection system or its illumination system. The projection system numerical aperture may thus be constrained to allow alignment operation over a wide range of wavelengths, while retaining a higher numerical aperture, corrected for only a narrow range of wavelengths, for exposure operations.

An alignment illumination system is arranged such that only the reticle keys are illuminated. The alignment system may thus have a high signal to noise ratio.

Two different line spacings may be provided on a reticle and a wafer for reducing potential alignment ambiguities. These might arise because the initial alignment position error in X, Y, and rotation combined with a possible magnification error between the wafer and the reticle image cause the limited unambiguous range dof the grating alignment patterns to be exceeded at one of more positions around the field.

Sharing of an illumination system and other optical elements enables two complementary alignment systems, a normal incidence system and a glancing incidence system, to be operated simultaneously in a practical stepper. This provides additional flexibility for difficult alignment situations, for example a wafer having several layers of metalization.

The alignment system features are achieved primarily by direct referencing optical means. As such, blind stepping accuracy in a stepper is not essential. Further, alignment arrangements are such that they may be used in a field by field, global, or enhanced global alignment modes.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. An alignment system for a stepper employing a Half-Field Dyson projection system; wherein said alignment system may be used to align an image of at least one key disposed on a reticle with at least one target disposed on a wafer, in which said one key includes a key diffraction-grating pattern having a given angular orientation and a given line spacing and said one target includes a target diffraction-grating pattern having an angular orientation corresponding to said given angular orientation and a line spacing substantially equal to a predetermined integer multiple of said given line spacing; and wherein said alignment system comprises:

first means including said Half-Field Dyson projection system for imaging alignment light diffracted from said one-key diffraction-grating pattern onto said wafer in response to said one-key diffraction-grating being illuminated with alignment light comprising a given range of wavelengths; and second means for detecting coincidence in the position of said one wafer target and the position on said wafer of the image of said one reticle key, wherein said second means includes third means shaped, sized and positioned to have incident thereon only diffracted alignment light of at least two certain selected orders reflected from said one-target diffraction-grating pattern and substantially no diffraction-order alignment light reflected from said one-key diffraction-grating pattern, and said second means detects changes in the intensity of alignment light incident on said third means as said wafer and said reticle are moved relative to one another, whereby said one wafer target substantially coincides with the image on said wafer of said one reticle key when the intensity of alignment light incident on said third means is at a maximum.

2. The alignment system defined in claim 1, wherein said predetermined integer multiple is two.

3. The alignment system defined in claim 1, wherein: said first means includes an alignment stop associated with a partially-reflective primary mirror of said Half-Field Dyson projection system having; an area which is small relative to the area of said partially-reflective primary mirror and is reflective, over said given range of wavelengths, said alignment stop being shaped, sized and positioned to have incident thereon at least two diffraction-orders of alignment light excluding said zero order reflected from said one-key diffraction-grating pattern, which incident diffraction-order alignment light is reflected from said alignment stop and imaged on said one-target diffraction-grating pattern when said wafer is positioned so that said one target substantially coincides with the image of said one reticle key.

4. The alignment system defined in claim 3, wherein: said given range of wavelengths of said alignment light comprises a wavelength spectrum which is relatively wide with respect to the wavelength spectrum of light used by said stepper for wafer-exposure purposes; and said partially-reflective primary mirror comprises a multilayer dielectric coating that provides a reflectance over most of said wavelength spectrum of said alignment light which is relatively small with respect to the reflectance at said wavelength spectrum used by said stepper for wafer-exposure purposes.

5. The alignment system defined in claim 3, wherein said second means comprises:

detector means for detecting changes in the intensity of alignment light incident thereon; and an image relay including a pick up assembly, which is small relative to and is disposed in front of said primary mirror of said Half-Field Dyson projection system, for receiving near-normal alignment light diffracted from said one-target diffraction-grating pattern and directing it to said detector means.

6. The alignment system defined in claim 3, wherein said second means comprises:
   detector means positioned to detect changes in the intensity of that high diffraction order alignment light reflected from said one-target diffraction-grating pattern that is directed outside of the aperture of said partially-reflective primary mirror of said Half-Field Dyson projection system and is incident thereon.

7. The alignment system defined in claim 1, wherein said alignment system may be used to align an image of at least one pair of adjacent keys disposed on said reticle with at least one pair of adjacent targets disposed on said wafer, (1) said adjacent keys and said adjacent targets of each of said one pairs having corresponding given positions with respect to one another, (2) a first of said one pair of keys including a first key diffraction-grating pattern having a given angular orientation and a given line spacing and a second of said one pair of keys including a second key diffraction-grating pattern having an angular orientation substantially orthogonal to said given angular orientation and having said given line spacing, and (3) a first of said one pair of targets including a first target diffraction-grating pattern having an angular orientation corresponding to said given angular orientation and having a line spacing substantially equal to a predetermined integer multiple of said given line spacing, and a second of said one pair of targets including a second target diffraction-grating pattern having an angular orientation substantially orthogonal to said angular orientation of said first of said one pair of targets and having a line spacing substantially equal to a predetermined integer multiple of said given line spacing; and wherein:
   said first means includes means for illuminating both said first and second key diffraction-grating patterns with alignment light; and
   said third means is shaped, sized and positioned to have incident thereon only predetermined-order diffracted alignment light reflected from said both said first and second target diffraction-grating patterns and substantially no diffraction-order alignment light reflected from either said first or second key diffraction-grating patterns, for detecting changes in the intensity of alignment light incident on said third means as said wafer and said reticle are moved relative to one another, whereby both said first and second wafer target patterns substantially coincide with the image of said first and second reticle key diffraction-grating patterns when the intensity of alignment light incident on said detector means is at a maximum.

8. The alignment system defined in claim 7, wherein said predetermined integer multiple is two.

9. The alignment system defined in claim 7, wherein:
   said first means includes an alignment stop associated with a partially-reflective primary mirror of said Half-Field Dyson projection system having an area which is small relative to the area of said partially-reflective primary mirror and is reflective over said given range of wavelengths, said alignment stop being shaped, sized and positioned to-have incident thereon at least two diffraction-orders of alignment light excluding said zero order reflected from said key diffraction gratings of said one pair of adjacent keys, which incident diffraction-order alignment light is reflected from said alignment stop and imaged on said target diffraction gratings of said one pair of adjacent targets when said wafer is positioned so that said target diffraction gratings of said one pair of adjacent wafer targets substantially coincide with the image of said reticle key diffraction gratings.

10. The alignment system defined in claim 9, wherein:
    said shape, size and position of said alignment stop is such that substantially no alignment light is incident thereon other than said certain diffraction-order alignment light different from said zero order corresponding to said given and said orthogonal-to-said-given angular orientations and said given line spacing from said pair of key diffraction gratings.

11. The alignment system defined in claim 9, wherein said second means comprises:
    detector means for detecting changes in the intensity of alignment light incident thereon; and
    an image relay including a pick up assembly, which is small relative to and is disposed in front of said highly-reflective stop, for receiving near-normal alignment light diffracted from both said first and second of said one pair of adjacent target diffraction-grating patterns and directing it to said detector means.

12. The alignment system defined in claim 9, wherein said third means comprises:
    detector means for detecting changes in the intensity of that high diffraction order alignment light reflected from both said first and second of said one pair of adjacent target diffraction-grating patterns that is directed outside of the aperture of said partially-reflective primary mirror of said Half-Field Dyson projection system and is incident thereon.

13. The alignment system defined in claim 7, wherein said alignment system may be used to align an image of a plurality of separated pairs of said adjacent reticle keys, each of said pairs of said adjacent keys include (4) a first key diffraction-grating pattern having an angular orientation and a line spacing and (5) a second key diffraction-grating pattern having an angular orientation substantially orthogonal to the angular orientation of said first key and the same line spacing as that of the first key; a corresponding plurality of separated pairs of said adjacent targets, and each of said pairs of said adjacent wafer targets include (6) a first target diffraction-grating pattern having substantially the same angular orientation as the first key diffraction-grating pattern of that pair of said adjacent keys with which it corresponds, and having a line spacing substantially equal to a predetermined integer multiple of said line spacing of the key diffraction-grating patterns of that pair of said adjacent keys with which it corresponds and (7) a second target diffraction-grating pattern having substantially the same angular orientation-as the second key diffraction-grating pattern of that pair of said adjacent keys with which it corresponds, and having line spacing substantially equal to said predetermined integer multiple of said line spacing of the key diffraction-grating patterns of that pair of said adjacent keys with which it corresponds; and wherein:
    said first means includes means for illuminating both said first and second reticle key diffraction-grating patterns of each of said separated pairs of said adjacent keys with alignment light; and said third means is shaped, sized and positioned to have incident thereon only predetermined-order diffracted alignment light reflected from said both said first and second target diffraction-grating patterns of each of said separated pairs of said adjacent targets and substantially no diffraction-order alignment light reflected from either said first or second key diffraction-grating patterns of any of said separated pairs of said adjacent keys, for detecting changes in the intensity of alignment light incident on said third means as said wafer and said reticle are moved relative to one another, whereby both said first and second target diffraction-grating patterns of all of said separated pairs of said adjacent targets substantially coincide with the image on said wafer of both said first and second key diffraction-grating patterns of all of said separated pairs of said adjacent keys when the intensity of alignment light incident on said third means is at a maximum.

14. The alignment system defined in claim 13, wherein said predetermined integer multiple is two.

15. The alignment system defined in claim 13, wherein:
said first means includes an alignment stop associated with a partially-reflective primary mirror of said Half-Field Dyson projection system having an area which is small relative to the area of said partially-reflective primary mirror and is reflective over said given range of wavelengths, said alignment stop being shaped, sized and positioned to have incident thereon at least two diffraction-orders of alignment light excluding said zero order reflected from said key diffraction gratings of said key diffraction gratings of all of said plurality of separated pairs of said adjacent keys, whereby both said first and second target diffraction-grating patterns of all of said plurality of separated pairs of said adjacent targets substantially coincide with the image on said wafer of both said first and second key diffraction-grating patterns of all of said plurality of separated pairs of said adjacent keys when the intensity of alignment light incident on said third means is at a maximum.

16. The alignment system defined in claim 15, wherein:
said shape, size and position of said alignment stop is such that substantially no alignment light is incident thereon other than said certain diffraction-orders and excluding said zero order corresponding to said given and said orthogonal-to-said-given angular orientations and said given line spacing from said pair of key diffraction gratings of all of said plurality of separated pairs of said adjacent keys.

17. The alignment system defined in claim 15, wherein said second means comprises:
an image relay including a pick up assembly, which is disposed in front of said primary mirror of said Half-Field Dyson projection system, for receiving near-normal alignment light diffracted from the target diffraction gratings of all of said plurality of pairs of separated pairs of said adjacent targets and directing it to said detector means.

18. The alignment system defined in claim 15, wherein said third means comprises:
detector means for detecting changes in the intensity of that higher diffraction order alignment light reflected from the target diffraction gratings of all of said plurality of pairs of separated pairs of said adjacent targets that is directed outside of the aperture of said partially-reflective primary mirror of said Half-Field Dyson projection system and is incident thereon.

19. A reticle for use in an alignment system for a stepper employing a Half-Field Dyson projection system to align an image of keys disposed on said reticle with corresponding targets disposed on a wafer; the improvement wherein said reticle comprises:
a plurality of separated pairs of adjacent first and, second keys, said first key of any pair of said adjacent first and second keys comprising a key diffraction grating pattern having a given angular orientation and a given line spacing, and said second key of that pair of said adjacent first and second keys comprising a key diffraction grating pattern having an angular orientation substantially orthogonal to said given angular orientation that has said given line spacing.

20. The reticle defined in claim 19, wherein:
said plurality equals four in number; and
said reticle is a rectangular reticle with the position of each of said four separated pairs of adjacent keys being situated in the vicinity of a different one of the four corners of said rectangular reticle; and
said given angular orientation of both said first and second key diffraction gratings is substantially 45° with respect to sides of said rectangular reticle.

21. The alignment system defined in claim 19, wherein:
the first and second key diffraction-grating patterns of at least one of said plurality of separated pairs of said adjacent keys have a given line spacing different from at least the given line spacing of one other of said plurality of separated pairs of said adjacent keys.

22. The alignment system defined in claim 21, wherein:
the first and second key diffraction-grating patterns of said one of said plurality of separated pairs of said adjacent keys have a line width different from said one other of said plurality of separated pairs of said adjacent keys.

23. An alignment system for a stepper employing a Half-Field Dyson projection system; wherein said alignment system may be used to align an image of at least one grating-like key disposed on a reticle with at least one; grating-like target disposed on a wafer, in which said one grating-like reticle key has a given angular orientation and a given line spacing and said one grating-like wafer target has an angular orientation corresponding to said given angular orientation and a line spacing substantially equal to a predetermined integer multiple of said given line spacing; and wherein said alignment system comprises:
first means including said Half-Field Dyson projection system for providing illumination on the reticle key which appears to originate from the center of the projection system pupil and which images selected diffraction orders not including the zero order from the grating-like reticle key to the wafer target;
second means including an optical relay shaped, sized and positioned to collect and relay only predetermined low order, near-normal diffraction-orders from the grating-like wafer target which are received on a light detector that is used to locate the position of the intensity maximum as the wafer is moved relative to the reticle; and third means including an optical relay shaped, sized and positioned to collect and relay only predetermined high order, diffraction orders from the grating-like wafer target which lie outside the maximum numerical aperture of the projection system and which are received on at least one light detector used to locate the position of the intensity maximum as the wafer is moved relative to the reticle.

* * * * *